US009793283B1

(12) United States Patent
Pang et al.

(10) Patent No.: US 9,793,283 B1
(45) Date of Patent: Oct. 17, 2017

(54) HIGH CONDUCTIVITY CHANNEL FOR 3D MEMORY

(71) Applicant: SanDisk Technologies LLC, Plano, TX (US)

(72) Inventors: Liang Pang, Fremont, CA (US); Jayavel Pachamuthu, San Jose, CA (US); Yingda Dong, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/278,988

(22) Filed: Sep. 28, 2016

(51) Int. Cl.
*H01L 29/788* (2006.01)
*H01L 27/11556* (2017.01)
*H01L 27/11524* (2017.01)
*H01L 27/11582* (2017.01)
*H01L 27/1157* (2017.01)
*H01L 29/16* (2006.01)
*H01L 29/06* (2006.01)
*H01L 21/02* (2006.01)

(52) U.S. Cl.
CPC .. *H01L 27/11556* (2013.01); *H01L 21/02381* (2013.01); *H01L 21/02532* (2013.01); *H01L 27/1157* (2013.01); *H01L 27/11524* (2013.01); *H01L 27/11582* (2013.01); *H01L 29/0657* (2013.01); *H01L 29/16* (2013.01)

(58) Field of Classification Search
CPC ......... H01L 27/11556; H01L 27/11524; H01L 27/11582; H01L 27/1157
USPC .......................................................... 257/316
See application file for complete search history.

(56) References Cited

U.S. PATENT DOCUMENTS

| 8,847,302 | B2 | 9/2014 | Alsmeier et al. | |
|---|---|---|---|---|
| 9,147,468 | B1 | 9/2015 | Lue | |
| 9,224,473 | B1 | 12/2015 | Chen | |
| 9,331,093 | B2 | 5/2016 | Rabkin et al. | |
| 2012/0001247 | A1* | 1/2012 | Alsmeier | H01L 27/11551 257/316 |
| 2012/0001249 | A1* | 1/2012 | Alsmeier | H01L 27/11551 257/319 |
| 2012/0001250 | A1* | 1/2012 | Alsmeier | H01L 27/11551 257/319 |

* cited by examiner

*Primary Examiner* — Anthony Ho
(74) *Attorney, Agent, or Firm* — Vierra Magen Marcus LLP

(57) ABSTRACT

Disclosed herein is a 3D memory with vertical NAND strings, and method for fabricating the same. Each vertical NAND string has a source side select transistor having a body in contact with a single crystal silicon substrate. The NAND string channel is formed from silicon germanium (SiGe), which provides for greater electron mobility than silicon. The body of the source side select transistor comprises epitaxial crystalline silicon germanium (SiGe) in contact with the single crystal silicon substrate. By epitaxial crystalline SiGe it is meant that the crystalline SiGe has the same crystalline orientation as the single crystal silicon substrate.

19 Claims, 24 Drawing Sheets

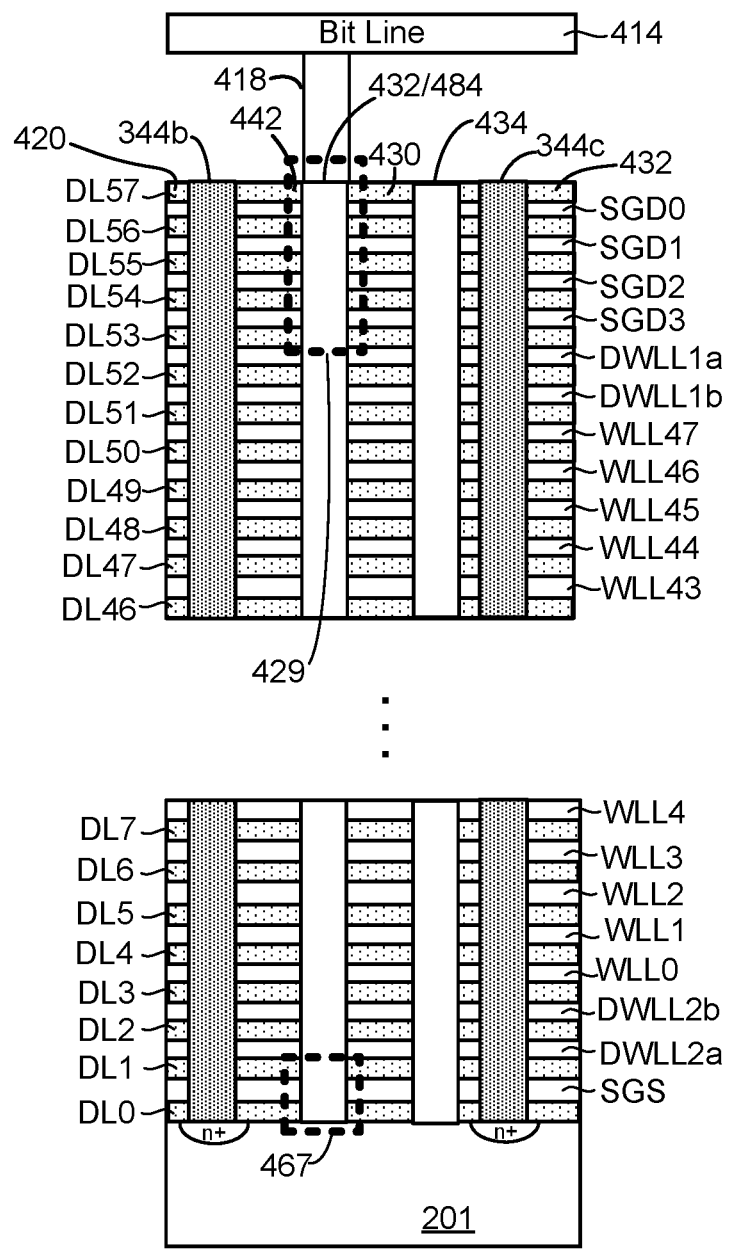

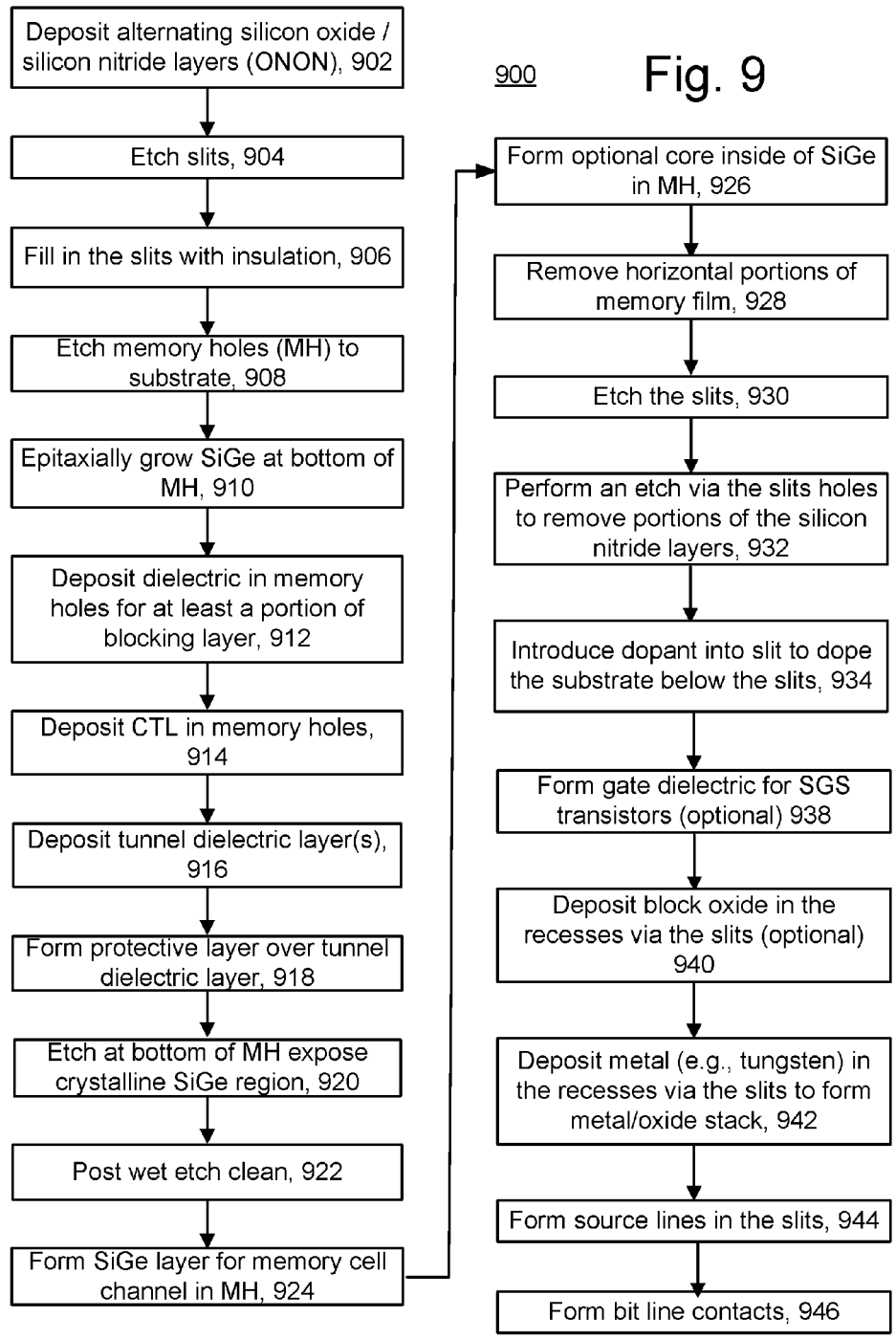

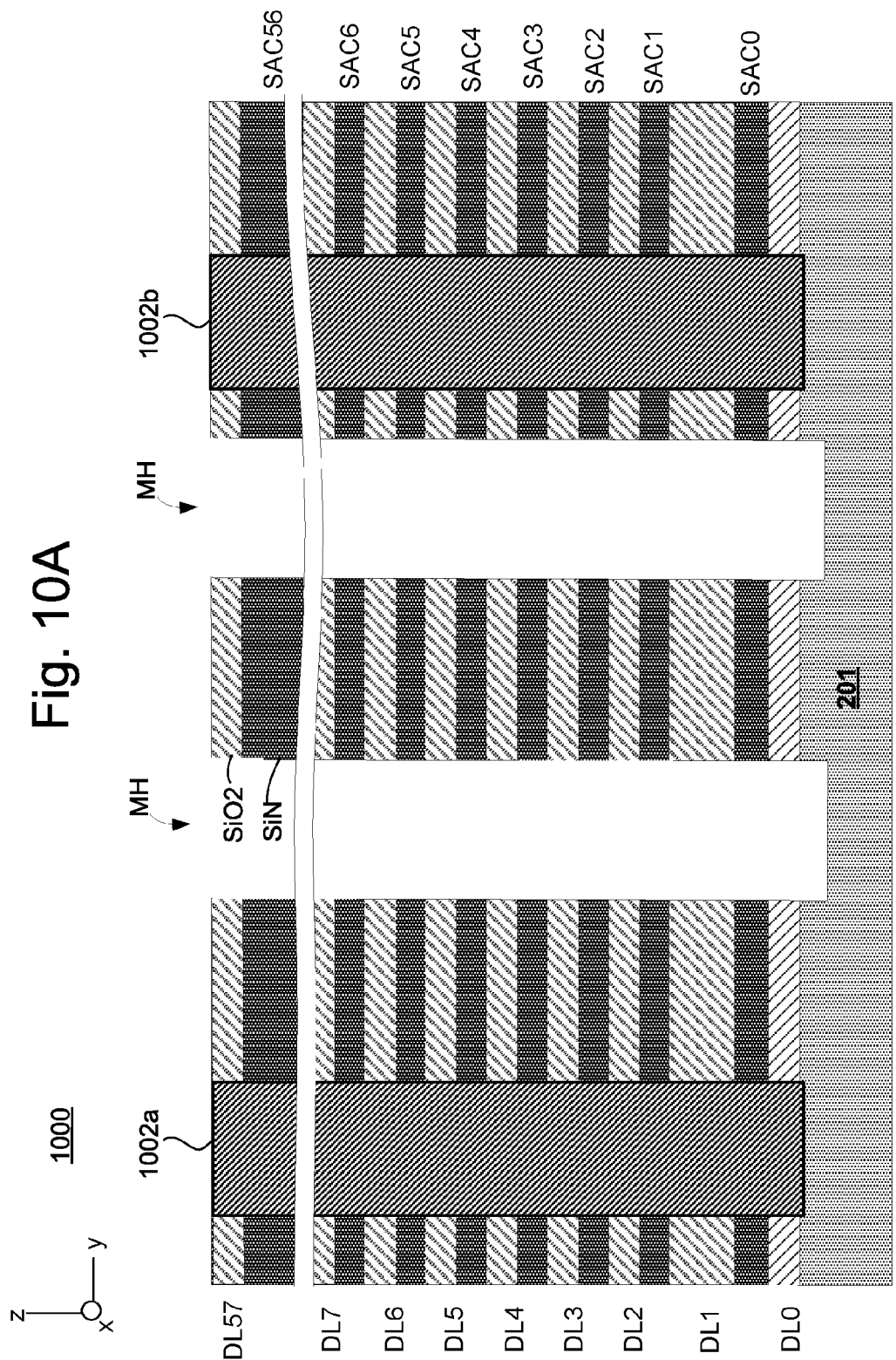

HIGH CONDUCTIVITY CHANNEL FOR 3D MEMORY

BACKGROUND

The present technology relates to non-volatile memory.

Recently, ultra high density storage devices have been proposed using a 3D stacked memory structure having strings of memory cells. One such storage device is sometimes referred to as a Bit Cost Scalable (BiCS) architecture. For example, a 3D NAND stacked memory device can be formed from an array of alternating conductor and insulator layers. In one technique, a memory hole is drilled in the layers to define many memory layers simultaneously. A NAND string is then formed by filling the memory hole with appropriate materials. Control gates of the memory cells are provided by the conductor layers. Select gates are formed at either end of the memory hole.

BRIEF DESCRIPTION OF THE DRAWINGS

Like-numbered elements refer to common components in the different figures.

FIG. 4C depicts a portion of an embodiment of three dimensional memory structure showing a cross-sectional view along line AA of FIG. 4B.

FIG. 9 is a flowchart of one embodiment of a process of forming NAND strings in a 3D memory array.

FIGS. 10A-10H depict results after various steps of one embodiment of the process of FIG. 9.

DETAILED DESCRIPTION

Figure 1:
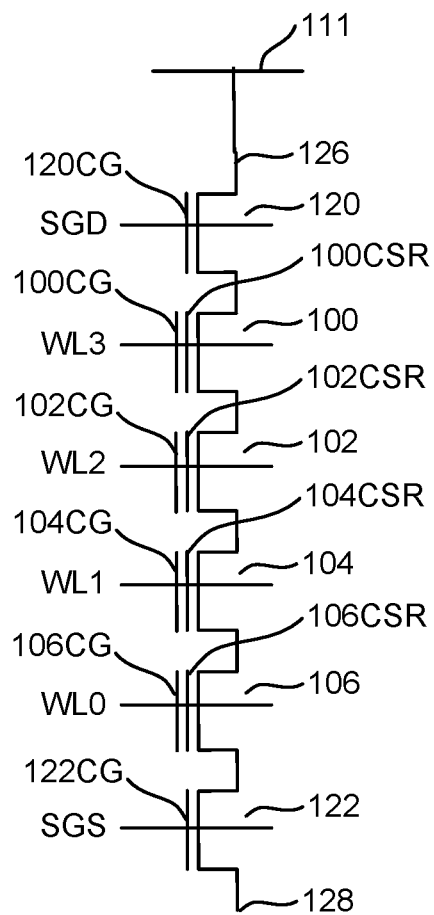
FIG. 1 is a circuit representation of a NAND string.

Disclosed herein is a 3D memory with vertical NAND strings, and method for fabricating the same. Each vertical NAND string has a source side select transistor having a body in direct contact with a single crystal silicon substrate. The NAND string channel is formed from silicon germanium (SiGe), which provides for greater electron mobility than silicon. Polysilicon has a relatively low electron mobility, which may result in low memory cell current.

In order to provide a good interface to the single crystal silicon substrate, the source side select transistor body could potentially be formed from silicon. However, this would result in a silicon to SiGe interface between the source side select transistor body and the NAND string channel. Due to the bandgap difference between silicon and SiGe, the conduction band offset at the junction of the source side select transistor body and the NAND string channel would degrade electron conduction. Therefore, the NAND string channel current would be decreased, which would sacrifice the benefit of using SiGe for the NAND string channel. Also, the valence band offset at the junction of the source side select transistor body and the NAND string channel would degrade performance.

The body of the source side select transistor comprises epitaxial crystalline silicon germanium (SiGe) in contact with the single crystal silicon substrate, in some embodiments. By epitaxial crystalline SiGe it is meant that the crystalline SiGe has the same crystalline orientation as the single crystal silicon substrate. In one embodiment, the SiGe body is epitaxially grown on the single crystal silicon substrate. Because the body of the source side select transistor is formed from epitaxial crystalline SiGe, a good interface between the source side select transistor body and the single crystal silicon substrate is provided.

Because the body of the source side select transistor is formed from SiGe, a conduction band offset between the source side select transistor body and the NAND string channel can be reduced. Note that source side select transistor body may comprise $Si_{1-x}Ge_x$ and the NAND string channel may comprises $Si_{1-y}Ge_y$. If "x" and "y" are the same, then the conduction band offset may be eliminated. That is, the conduction bands may be aligned. Likewise, the valence bands may be aligned. In some embodiments, "x" and "y" are not the same, but the band offsets (conduction and valence) can still be reduced relative to a silicon/SiGe interface.

As used herein, when an element, component or layer for example is described as being "on," "connected to," "coupled with," or "in contact with" another element, component or layer, it can be directly on, directly connected to, directly coupled with, in direct contact with, or intervening elements, components or layers may be on, connected, coupled or in contact with the particular element, component or layer, for example. When an element, component or layer for example is referred to as begin "directly on", "directly connected to", "directly coupled with", or "directly in contact with" another element, there are no intervening elements, components or layers for example.

A semiconductor region (e.g., substrate or film) may be roughly classified as crystalline or amorphous. An amorphous semiconductor region has disordered atomic arrangement and no crystalline component. An example is a semiconductor region in which no crystal part exists even in a microscopic region. Crystalline semiconductor regions include single-crystal and non-single-crystal semiconductor regions.

A non-single crystal semiconductor region can be crystalline to a different degree. For instance, a poly-crystalline semiconductor region is comprised of "grains". Within each grain, the material is in the crystalline phase. That is, within each grain, the crystalline structure is oriented in the same way. However, in different grains, the crystal orientation may be different.

One example of a non-volatile storage system that can implement the technology described herein is a flash memory system that uses the NAND structure, which includes arranging multiple memory cell transistors in series, sandwiched between two select transistors. The memory cell transistors in series and the select transistors are referred to as a NAND string. FIG. 1 is a circuit representation of a NAND string. The NAND string depicted in FIG. 1 includes four memory cell transistors 100, 102, 104 and 106 in series and sandwiched between (drain side) select transistor 120 and (source side) select transistor 122. Select transistor 120 connects the NAND string to a bit line 111. Select transistor 122 connects the NAND string to source line 128. In some embodiment, select transistor 122 has a body comprising epitaxial crystalline silicon germanium (SiGe) in contact with the crystalline silicon substrate. The crystalline silicon substrate is not depicted in FIG. 1. The source line 128 may contact the crystalline silicon substrate at a different locations from the select transistor 122.

Select transistor 120 is controlled by applying the appropriate voltages to select line SGD. The select line (SGD) is connected to a control gate terminal 120CG of the select transistor 120. Select transistor 122 is controlled by applying the appropriate voltages to select line SGS. The select line (SGS) is connected to a control gate terminal 122CG of the select transistor 122. Note that there may be more than one select transistor at each end of the NAND string, which work together as a switch to connect/disconnect the NAND string to and from the bit line and source line. For example, there may be multiple select transistors in series at each end of the NAND string.

Each of the memory cell transistors 100, 102, 104 and 106 has a control gate (CG) and a charge storage region (CSR). For example, memory cell transistor 100 has control gate 100CG charge storage region 1600CSR. Memory cell transistor 102 includes control gate 102CG and a charge storage region 102CSR. Memory cell transistor 104 includes control gate 104CG and charge storage region 104CSR. Memory cell transistor 106 includes a control gate 106CG and a charge storage region 106CSR. Control gate 100CG is connected to word line WL3, control gate 102CG is connected to word line WL2, control gate 104CG is connected to word line WL1, and control gate 106CG is connected to word line WL0.

Note that although FIG. 1 shows four memory cells in the NAND string, the use of four memory cells is only provided as an example. A NAND string can have fewer than four memory cells or more than four memory cells. The discussion herein is not limited to any particular number of memory cells in a NAND string. One embodiment uses NAND strings with some memory cells are used to store data and one or more of the memory cells are referred to as dummy memory cells because they do not store data.

A typical architecture for a flash memory system using a NAND structure will include many NAND strings. Each NAND string may be connected to the common source line by its source select transistor controlled by select line SGS and connected to its associated bit line by its drain select transistor controlled by select line SGD. Bit lines may be shared with multiple NAND strings. The bit line may be connected to a sense amplifier.

The charge storage region (CSR) may utilize a non-conductive dielectric material to store charge in a non-volatile manner. In one embodiment, a triple layer dielectric formed of oxide-nitride-oxide ("ONO") is sandwiched between a conductive control gate and the memory cell channel. As one example, the ONO is silicon oxide, silicon nitride and silicon oxide. As another example, the ONO may be $Al_2O_3$—SiN—$SiO_2$. In the direction from the control gate toward the NAND channel, the first oxide (e.g., $Al_2O_3$) forms at least a portion of a blocking layer, which blocks un-desirable tunneling of electrons from CSR to control gate or from control gate to CSR. The silicon nitride is a charge trapping layer or charge storage region (CSR), in one embodiment. The second oxide (e.g., $SiO_2$) is tunneling dielectric through which electron can tunnel from the channel to the CSR during programming. The blocking layer can be a stack of dielectrics, e.g. $Al_2O_3$—$SiO_2$ in the direction from control gate toward the NAND channel, in one embodiment. The tunneling layer can be a stack of different dielectric films, e.g. $SiO_2$—SiN—$SiO_2$, in one embodiment. The cell is programmed by injecting electrons from the cell channel (or NAND string channel) into the nitride, where they are trapped and stored in a limited region. This stored charge then changes the threshold voltage of the cell in a manner that is detectable. The cell may be erased by injecting holes into the nitride. Cells may be erased by injecting holes into the nitride where they recombine with electrons, and thereby "cancel" or reduce the stored charge. Cells may be also erased by extracting electrons from the nitride, e.g., by applying an electric field making electrons tunnel from nitride to the channel. Cells may be erased by both these mechanisms combined.

Numerous types of materials can be used for the charge storage regions (CSR). In one embodiment, the charge storage regions are conductive floating gates. As one example, the conductive floating gate is formed from poly-silicon. This may be heavily doped polysilicon. Other types of non-volatile memory technologies can also be used.

Figure 2:
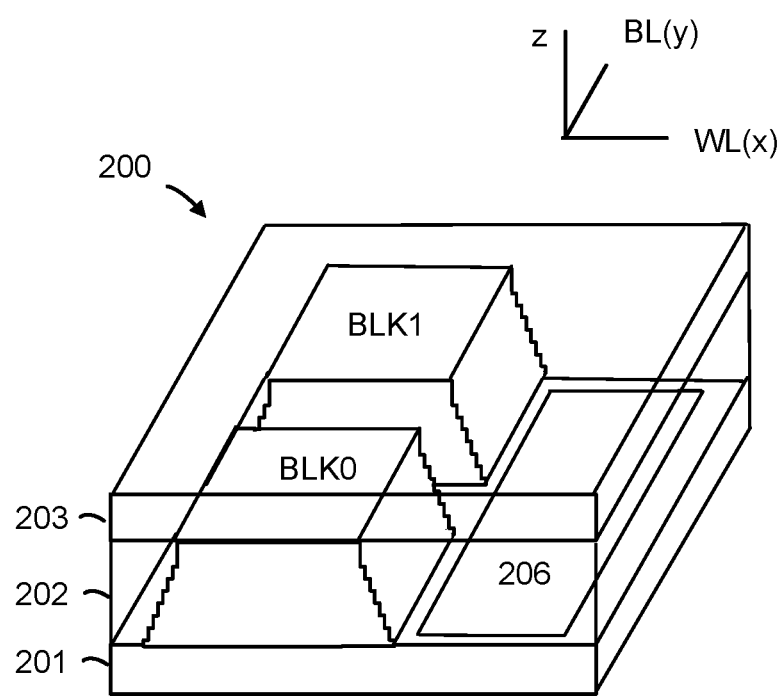
FIG. 2 is a perspective view of a 3D stacked non-volatile memory device.

FIG. 2 is a perspective view of a 3D stacked non-volatile memory device. The 3D memory device 200 includes a substrate 201. In one embodiment, the substrate 201 is formed from silicon. Thus, the substrate 201 may be a semiconductor substrate. In some embodiments, the substrate 201 is crystalline silicon. In some embodiments, the substrate 201 is single crystal silicon. The substrate 201 may be a semiconductor wafer. The substrate 201 has a major surface that extends in the x-y plane. On the substrate are example blocks BLK0 and BLK1 of memory cells and a peripheral area 206 with circuitry for use by the blocks. The substrate 201 can also carry circuitry under the blocks, along with one or more lower metal layers which are patterned in conductive paths to carry signals of the circuitry. The blocks are formed in an intermediate region 202 of the memory device. The circuitry associated with operation of the memory cells may be above or within the substrate 201. In one embodiment, the non-volatile memory device is monolithically formed in one or more physical levels of arrays of memory cells having an active area disposed above the substrate 201.

In an upper region 203 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. An x-y-z coordinate system is depicted, showing a y-direction (or bit line (BL) direction), an x-direction (or word line (WL) direction), as well as a z-direction. While two blocks are depicted as an example, additional blocks can be used, extending in the x- and/or y-directions.

In one possible approach, the length of the plane, in the x-direction, represents a direction in which signal paths to word lines extend in the one or more upper metal layers, and the width of the plane, in the y-direction, represents a direction in which signal paths to bit lines extend in the one or more upper metal layers. The z-direction represents a height of the memory device.

Figure 3:
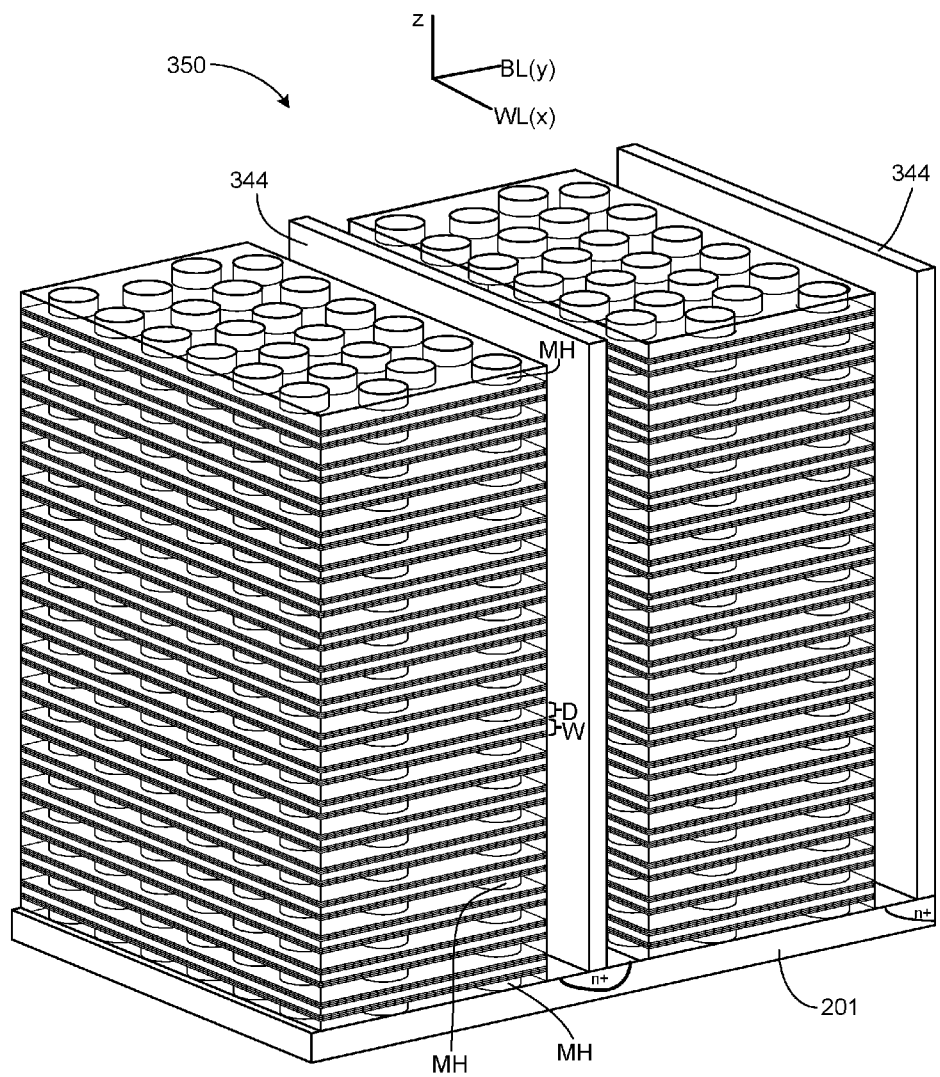
FIG. 3 is a perspective view of a portion of a three dimensional monolithic memory structure.

FIG. 3 is a perspective view of a portion of a three dimensional monolithic memory structure 350, which includes a plurality memory cells. For example, FIG. 3 shows a portion of one block of memory. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or fewer than 108-216 layers can also be used. The alternating dielectric layers and conductive layers are divided into "fingers" by local source lines 344. Note that the local source lines 344 may also be referred to as local interconnects LI. FIG. 3 only shows two fingers and two local interconnects LI. The local source lines 344 are conductive elements. Below and the alternating dielectric layers and word line layers is a substrate 201. Each local source line 344 is in electrical contact with an n+ diffusion region of the substrate 201, in one embodiment. Note that the local source lines 344 each have a major plane that extends in the x-z plane. In some embodiments, substrate 201 is single crystal silicon.

Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data.

The memory hole has a SiGe region that serves as a NAND string channel, in some embodiments. The end of the MH that is connected to the substrate 201 is used for the body of the source side select transistor, in some embodiments. The body of the source side select transistor comprises epitaxial crystalline silicon germanium (SiGe) in contact with the crystalline silicon substrate, in some embodiments. Thus, the memory hole comprises a string of memory cells having a string channel comprising silicon germanium in contact with the epitaxial crystalline silicon germanium of the select transistor body, in some embodiments. The source side select transistor may be used to connect/disconnect the string of memory cells to/from the local source lines 344.

Figure 4A:
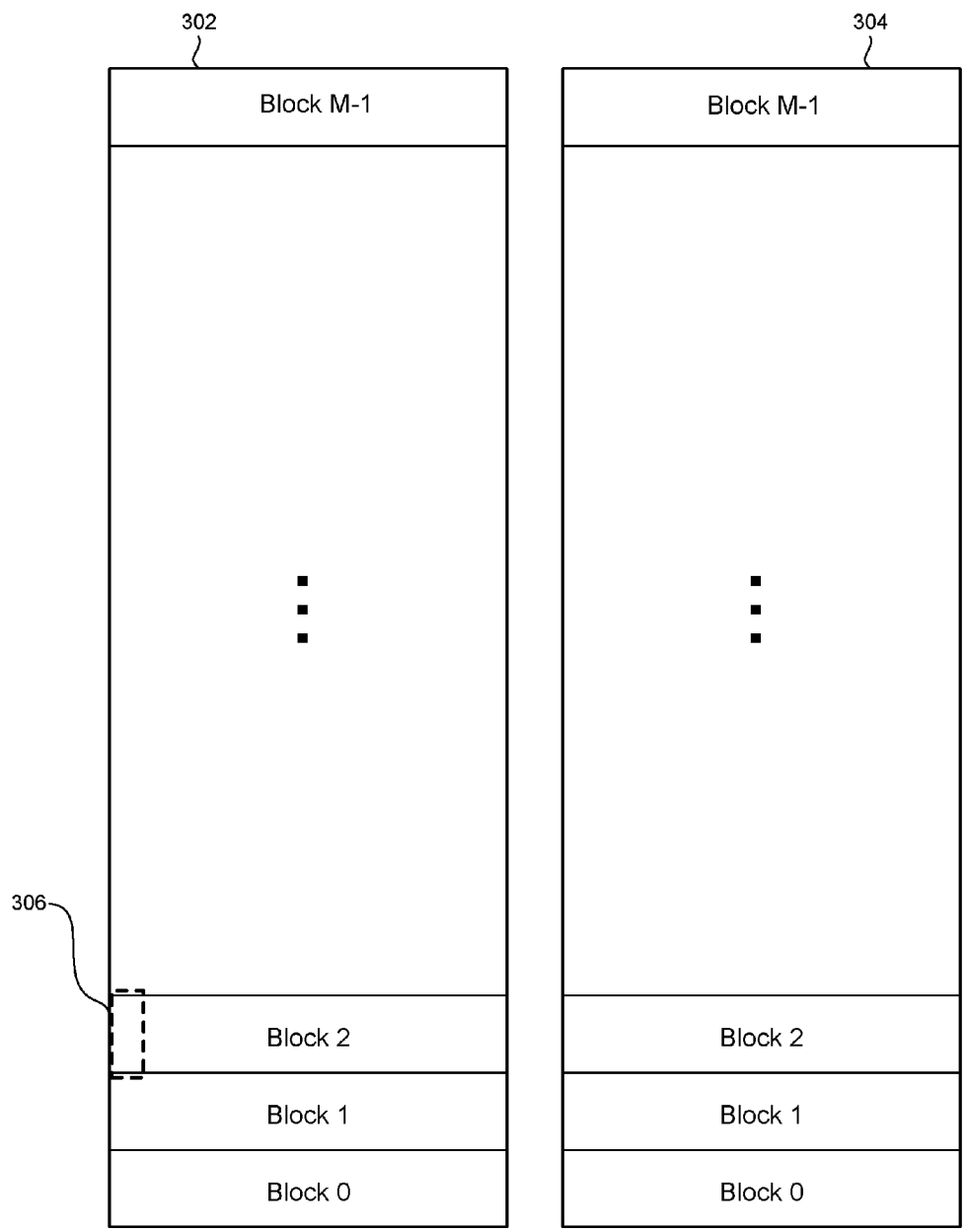
FIG. 4A is a block diagram explaining one example organization of memory structure.

FIG. 4A is a block diagram explaining one example organization of memory structure 350, which is divided into two planes 302 and 304. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 302 includes block 0, 2, 4, 6, . . . and plane 304 includes blocks 1, 3, 5, 7, . . . .

Figure 4B:
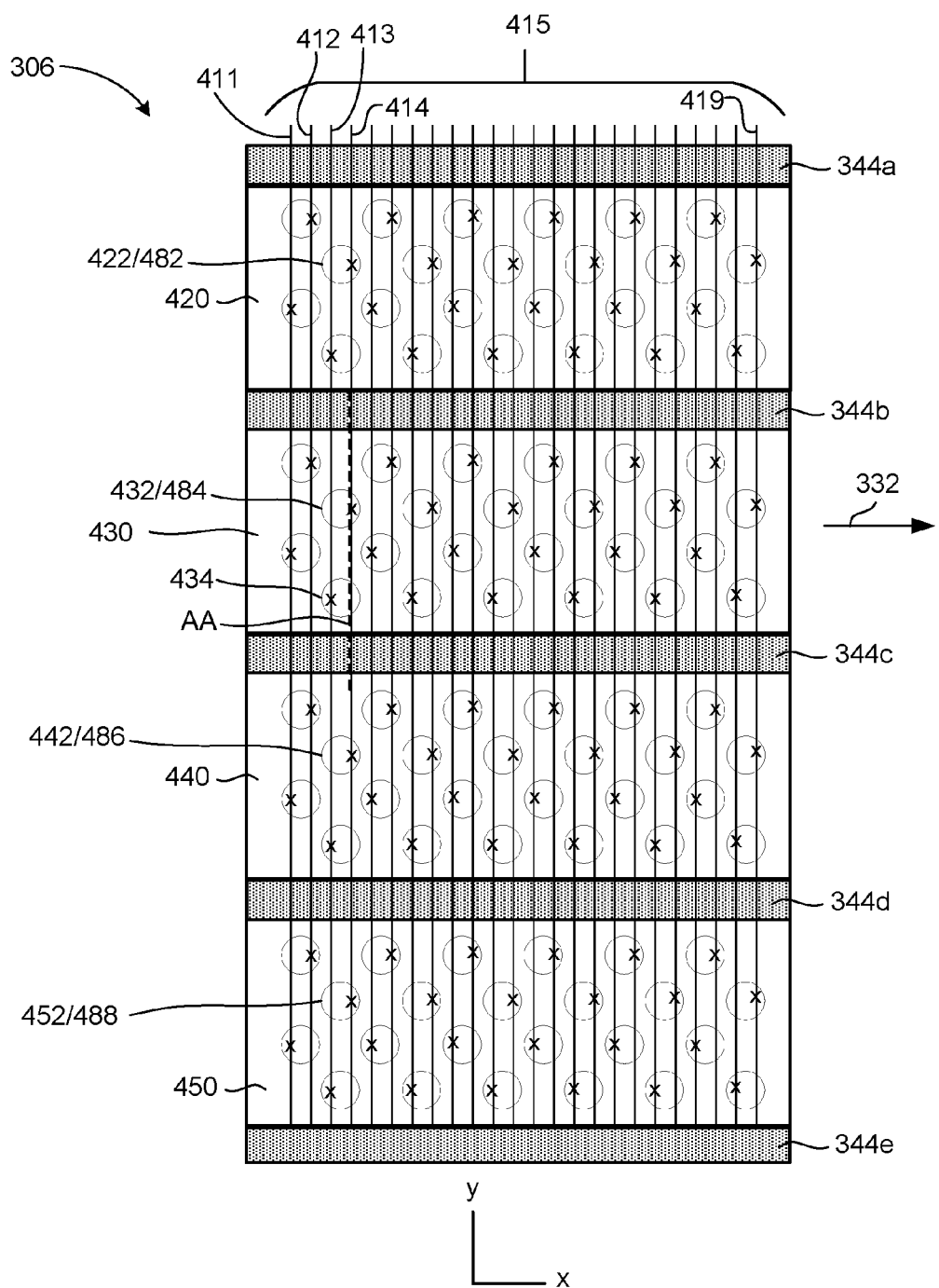
FIG. 4B depicts a plurality of circles that represent the vertical columns.

FIGS. 4B-4C depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in direction of 332. In one embodiment, the memory array will have 60 layers. Other embodiments have less than or more than 60 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 332, the block includes more vertical columns than depicted in FIG. 4B.

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local source lines 344a, 344b, 344c, 344d, 344e. Local source lines may also be referred to as "local interconnects". Local interconnects 344 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side select lines and the drain side select lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or fewer regions per block, more or fewer rows of vertical columns per region and more or fewer rows of vertical columns per block.

FIG. 4B also shows the vertical columns being staggered. In other embodiments, different patterns of staggering can be used. In some embodiments, the vertical columns are not staggered.

FIG. 4C depicts a portion of an embodiment of three dimensional memory structure 350 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; one source side select layer SGS; four dummy word line layers DWLL1a, DWLL1b, DWLL2a and DWLL2b; and forty eight data word line layers WLL0-WLL47 for connecting to data memory cells. Other embodiments can implement more or fewer than four drain side select layers, more than one source side select layer, more or fewer than four dummy word line layers, and more or fewer than forty eight word line layers (e.g., 96 word line layers). Vertical columns 432 and 434 are depicted protruding through the drain side select layers, source side select layer, dummy word line layers and word line layers. In one embodiment, each vertical column comprises a NAND string. For example, vertical column 432 comprises NAND string 484. Below the vertical columns and the layers listed below is crystalline silicon substrate 101. The substrate 201 is single crystal silicon, in some embodiments. The local source lines 344b, 344c are in direct electrical contact with an n+ region of the substrate 201, in this embodiment. The NAND string of vertical column 432 has a source end at a bottom of the stack and a drain end at a top of the stack. As in agreement with FIG. 4B, FIG. 4C show vertical column 432 connected to Bit Line 414 via bit line contact 418. In some embodiments, the bit line contact is n+ silicon. This provides for low contact resistance to the SiGe NANG string channel.

For ease of reference, drain side select layers SGD0, SGD1, SGD2 and SGD3; source side select layer SGS; dummy word line layers DWLL1a, DWLL1b, DWLL2a and DWLL2b; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Alternating with the conductive layers are dielectric layers DL0-DL57. For example, dielectric layer DL50 is above word line layer WLL46 and below word line layer WLL47. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DWLL1a, DWLL1b, DWLL2a and DWLL2b connect to dummy memory cells. A dummy memory cell does not store user data, while a data memory cell is eligible to store user data. However, structurally dummy and data memory cells are the same, in some embodiments. Drain side select layers SGD0, SGD1, SGD2 and SGD3 are used to electrically connect and disconnect NAND strings from bit lines. Source side select layer SGS is used to electrically connect and disconnect NAND strings from the source lines 344b, 344c.

Figure 5A:
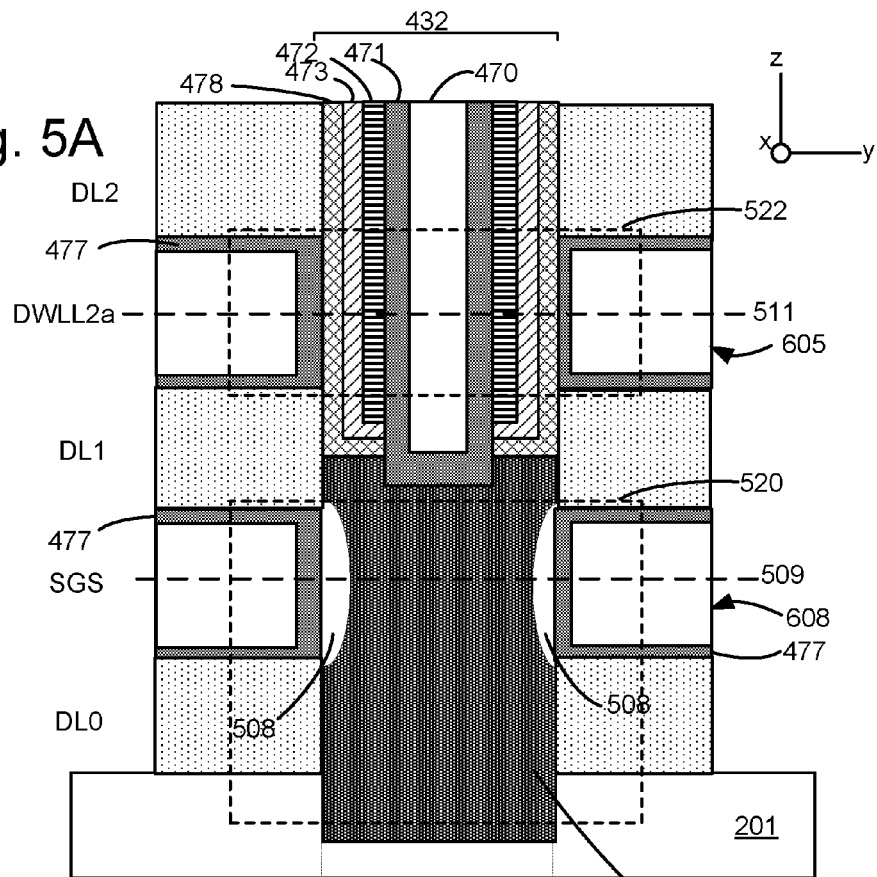
FIG. 5A depicts a close-up view of region 467 of FIG. 4C.

The channel of the NAND strings are formed from SiGe, in some embodiments. The body of the source side select transistor resides at the bottom of each of the vertical columns 432 and 434. The body of the source side select transistor is epitaxial crystalline silicon germanium (SiGe), in some embodiments. The epitaxial crystalline silicon germanium (SiGe) in contact with a crystalline silicon substrate, in one embodiment. The substrate 201 is a single crystal of silicon, at least where the epitaxial crystalline SiGe contacts the substrate 201, in some embodiments. A region 467 of NAND string 484 is highlighted. FIG. 5A shows a close up view of region 467.

Figure 5B:
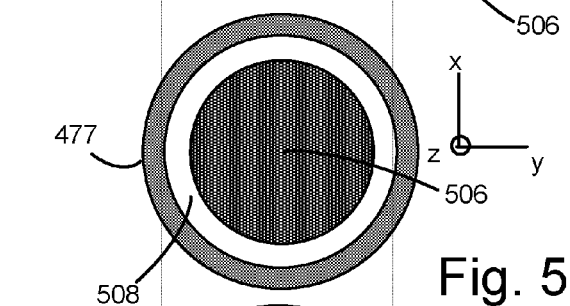
FIG. 5B depicts a cross-sectional view of the column 432 of FIG. 5A along line 509.
Figure 5C:
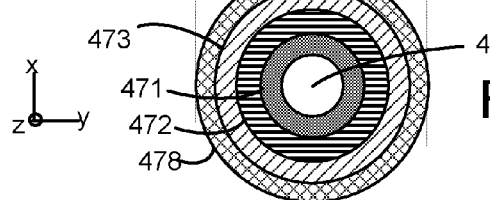
FIG. 5C depicts a cross-sectional view of the column 432 of FIG. 5A along line 511.

FIG. 5A depicts a close-up view of region 467 of FIG. 4C, which includes column 432 of FIG. 4C, showing a portion of source-side select transistor 520 and a dummy memory cell 522. FIG. 5B depicts a cross-sectional view of the column 432 of FIG. 5A along line 509. FIG. 5C depicts a cross-sectional view of the column 432 of FIG. 5A along line 511. The region 467 shows portions of the dielectric layers DL0 to DL2 and the conductive layers SGS and DWLL2a. In one embodiment, vertical column 432 includes an inner core layer 470 that is made of a dielectric, such as $SiO_2$. Other materials can also be used. Surrounding inner core 470 is SiGe channel 471. Surrounding SiGe channel 471 is a tunneling dielectric 472. The channel 471 comprises $Si_{1-y}Ge_y$. The conductivity of the channel 471 typically increases when the germanium concentration is higher. In one embodiment, "y" is greater than 0.5. In one embodiment, the germanium concentration is graded. For example, the germanium concentration varies in the radial direction. In one embodiment, the concentration of germanium increases in a direction away from the tunneling dielectric 472.

In one embodiment, tunneling dielectric 472 has an ONO structure. Surrounding tunneling dielectric 472 is charge trapping layer 473, such as (for example) Silicon Nitride. Other memory materials and structures can also be used. Surrounding charge trapping layer 473 is blocking layer 478. Blocking layer 478 comprise a layer of $SiO_2$, in one embodiment. Region 477 also serves as a blocking layer. Note that region 477 is outside of the memory hole, but could alternatively be inside of the memory hole adjacent to (e.g., surrounding) layer 478. Region 477 is a layer of $Al_2O_3$, in one embodiment.

Region 520 represents a portion of the source-side select transistor 520. The source-side select transistor 520 has a crystalline SiGe body 506 in column 432, which extends partway into crystalline silicon substrate 201. The crystalline SiGe 506 is epitaxial crystalline silicon germanium, in one embodiment. In some embodiments, the substrate 201 is a single crystal of silicon, at least where the crystalline SiGe 506 is in direct contact with the substrate 201. By "epitaxial crystalline" silicon germanium it is meant that the crystalline structure of the silicon germanium in the body 506 is aligned with the crystalline structure of the single crystal silicon substrate 201. In one embodiment, the body 506 is a solid pillar of epitaxial crystalline silicon germanium. By a "solid" pillar it is meant that the pillar is not hollow and does not have a filler material in the interior. In contrast, the silicon germanium channel 477 is not solid in the embodiment of FIGS. 5A and 5C, as there is a core 471. However, note that the silicon germanium channel 477 could also be a solid pillar.

A gate dielectric region 508 is depicted. The gate dielectric 508 is oxidized SiGe, in one embodiment. Conductive region 608 serves as a control gate for the source side select transistor 520. Region 477 and region 508 together serve as at least a portion of a gate dielectric for the source-side select transistor. In one embodiment, region 477 is Al2O3. Note that conductive region 608 may surround region 477. Dielectric layer DL0 may serve as another portion of the gate dielectric of the source side select transistor 520.

Figure 6:
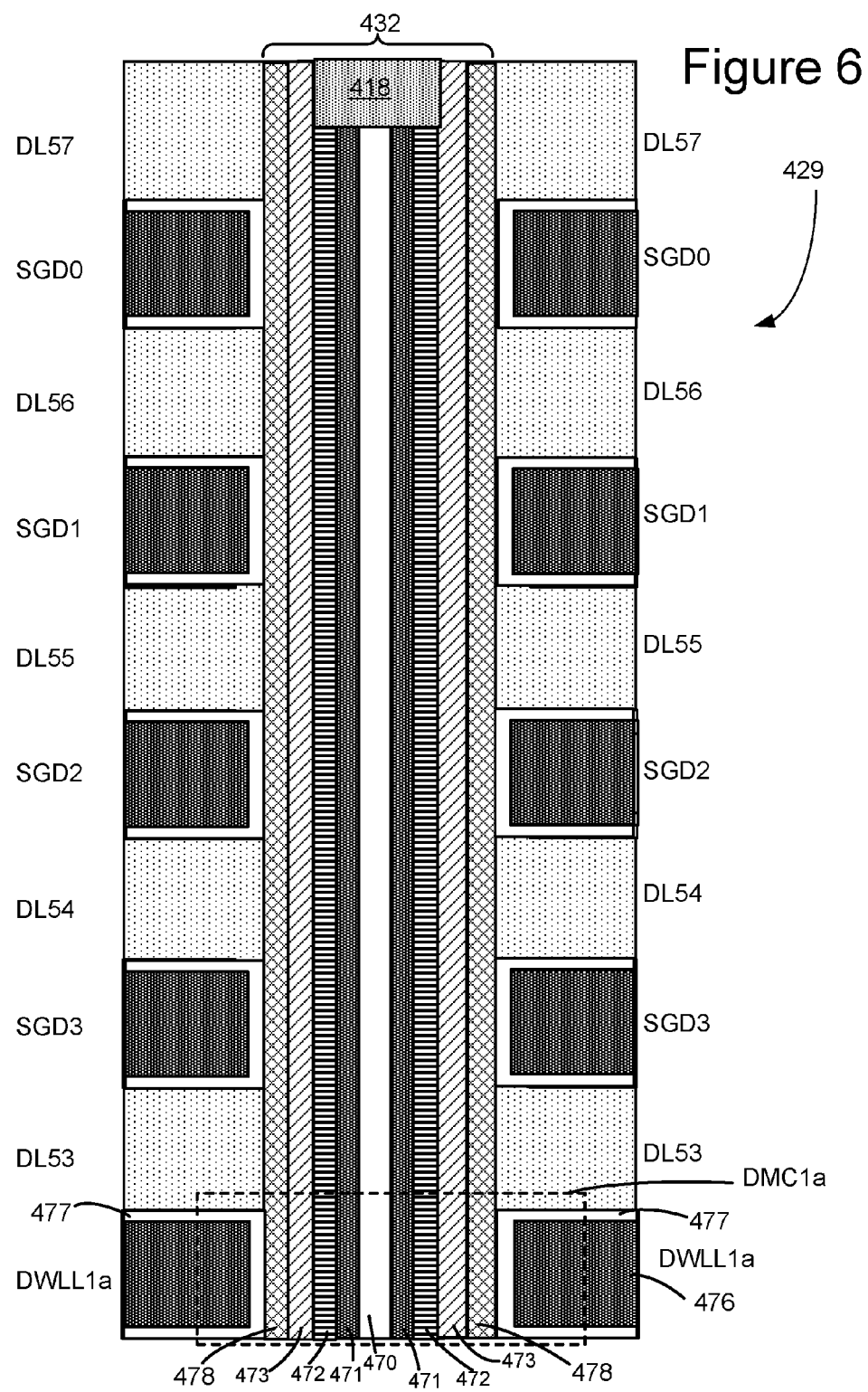
FIG. 6 depicts a cross sectional view of region 429 of FIG. 4C that includes a portion of vertical column 432.

FIG. 6 depicts a cross sectional view of region 429 of FIG. 4C that includes a portion of vertical column 432. In one embodiment, the vertical columns are round in horizontal cross section and include four layers; however, in other embodiments more or fewer than four layers can be included and other shapes can be used. The layers 470, 471, 472, 472, 478 in the portion of the vertical column 432 depicted in FIG. 6 are similar to those at the dummy memory cell 522 in FIG. 5A. There may be some variance in the thickness of these layers between the top and bottom portion of the NAND string.

FIG. 6 depicts dielectric layers DL53, DL54, DL55, DL56 and DL57, as well as layers DWLL1a, SGD3, SGD2, SGD1, and SGD0. The dummy word line layer DWLL1a includes a word line region 476 surrounded by an aluminum oxide layer 477. The physical interaction of the word line layer with the vertical column forms a memory cell. In FIG. 6, the memory cell DMC1a is a dummy memory cell. Note that the physical construction of a regular memory cell (a layers WLL0-WLL47 in FIG. 4C) is the same as the dummy cell. Thus, a memory cell, in one embodiment, comprises channel 471, tunneling dielectric 472, charge trapping layer 473, silicon oxide layer (e.g., $SiO_2$) 478, aluminum oxide layer 477 and word line region 476. Together, the aluminum oxide layer 477 and the silicon oxide layer may be referred to as a blocking layer. In other architectures, a memory cell may have a different structure; however, the memory cell would still be the storage unit.

As noted in the discussion of FIG. 5A, the channel 471 comprises silicon germanium. A silicon germanium channel may have conduction band misalignment at the drain side. By using an n+ silicon bit line contact 418, low contact resistance is achieved.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Although the example memory system discussed above is a three dimensional memory structure that includes vertical NAND strings with charge-trapping material, other memory structures can also be used with the technology described herein. For example, the charge trapping layer 473 can be replaced with a conductive layer. In this manner, floating gate memories can also be used.

Figure 7:
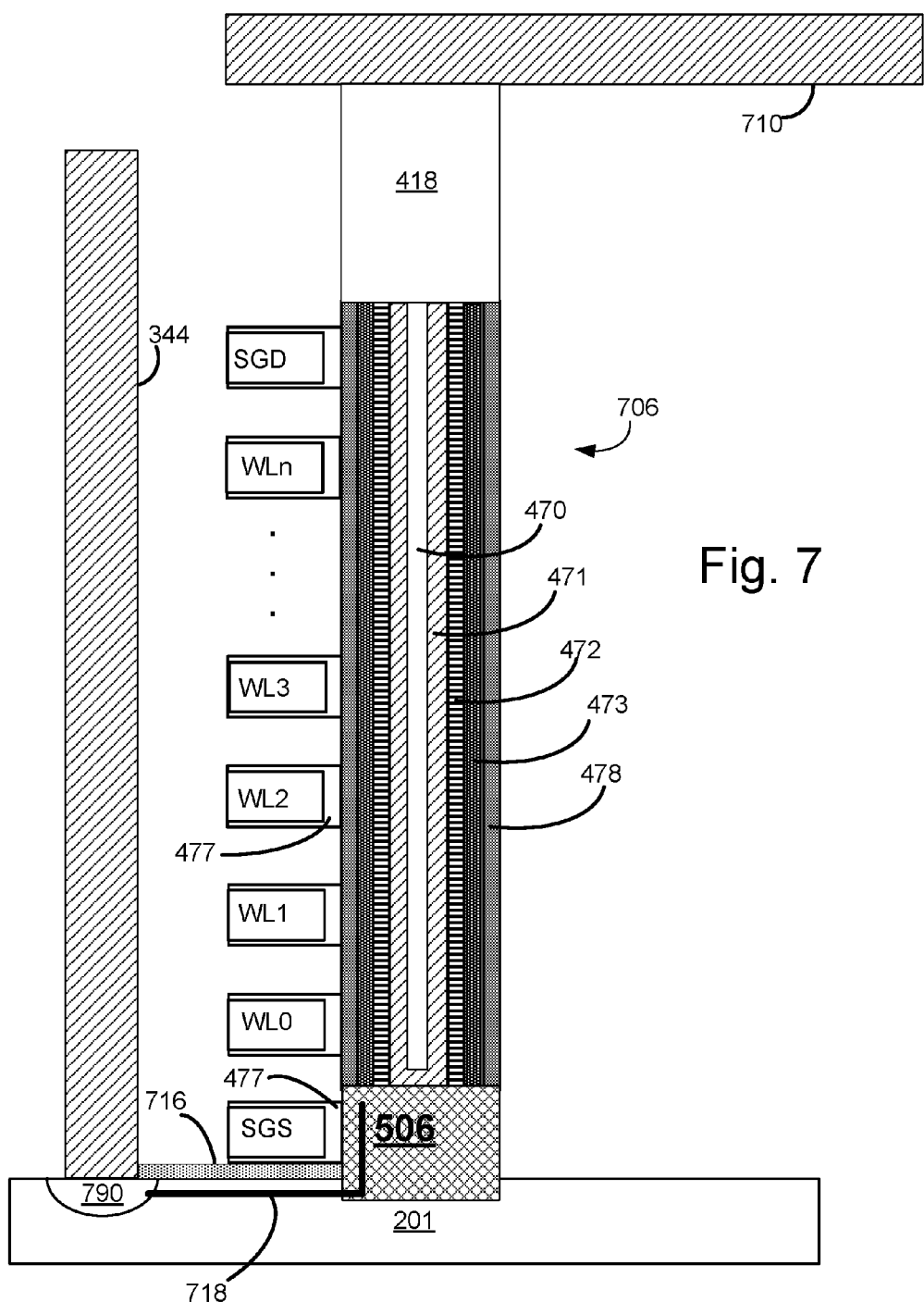
FIG. 7 shows electrical connections between of one embodiment the NAND strings and a bit line and a local source line.

FIG. 7 shows electrical connections between of one embodiment the NAND strings and a bit line 710 and a local source line 344. A single column 706 is depicted. The column 706 has silicon oxide region 478, charge storage region 473, tunnel dielectric 472, SiGe channel 471, and core 470. On one side of the column 706, SGS, several word lines (WL0, WL1, WL2, WL3, . . . WLn), and SGD are depicted. Also, an aluminum oxide layer 477 is associated with each of SGS, WL0, WL1, WL2, WL3, WLn, and SGD. Note that the word lines and blocking layer may completely surround the column 706. However, this is not depicted in FIG. 7 so as to not obscure the diagram. Also, the dielectric layers that alternate with the word line layers are not depicted in FIG. 7.

The bit line contact 418 is formed from n+ silicon, in one embodiment. The bit line 710 is formed from metal, in one embodiment. Example metals for the bit line include, but are not limited to, titanium, tungsten, copper, aluminum, and molybdenum.

FIG. 7 also depicts a source side select transistor. The SGS region, which may be formed from metal, serves as the control gate of the source side select transistor, in one embodiment. The portion of the aluminum oxide layer 477 that is between SGS and the SiGe body 506 serves as a gate dielectric of the source side select transistor. The SiGe body 506 of the source side select transistor is formed from crystalline SiGe, in one embodiment. The SiGe body 506 of the source side select transistor is formed from epitaxial crystalline SiGe, in one embodiment. By epitaxial crystalline SiGe it is meant that the crystalline structure of the SiGe body 506 is aligned with the crystalline structure of a single crystal silicon portion of substrate 201 to which the SiGe body 506 makes direct contact.

In one embodiment, the source side select transistor epitaxial crystalline SiGe body 506 is in direct physical contact with the crystalline silicon substrate 201. The portion of the substrate 201 that is adjacent to the SiGe body 506 may be p-type. The channel 718 of the source side select transistor has a vertical component in the column 706 and a horizontal component in the substrate 201. A gate oxide 716 is depicted on the surface of the substrate 201. This gate oxide 716 may serve as a portion of the gate dielectric of the source side select transistor. The gate oxide 716 could layer DL0, as depicted in FIG. 5A.

Source 790 may act as a source region of the source side select transistor. The source 790 may be an n+ region. Thus, source 790 can be formed by heavily doping the silicon substrate 201. The n-type impurity can be phosphorous (P), arsenic (As) or a combination of both, for example.

The local source line 344 is in electrical contact with the source 790 of the source side select transistor. The local source line 344 is formed from metal, in one embodiment. Example metals include, but are not limited to, titanium, tungsten, copper, aluminum, and molybdenum. The local source line 344 can be electrically connected to the NAND string channel 471 by the action of the source side select transistor, when a respective bias is applied to the SGS line. Note that the local source line 344 may serve as a common source line for a number of NAND strings.

Note that the SiGe body 506 is not necessarily the entire body region of the source side select transistor, as a portion of substrate 201 (e.g., near the horizontal portion of channel 718) could be considered to form a portion of the body region of the source side select transistor.

In some embodiments, there is a single SGS layer in which the source side select transistor is formed. However, more than one SGS layer may be used for the source side select transistor.

Figure 8:
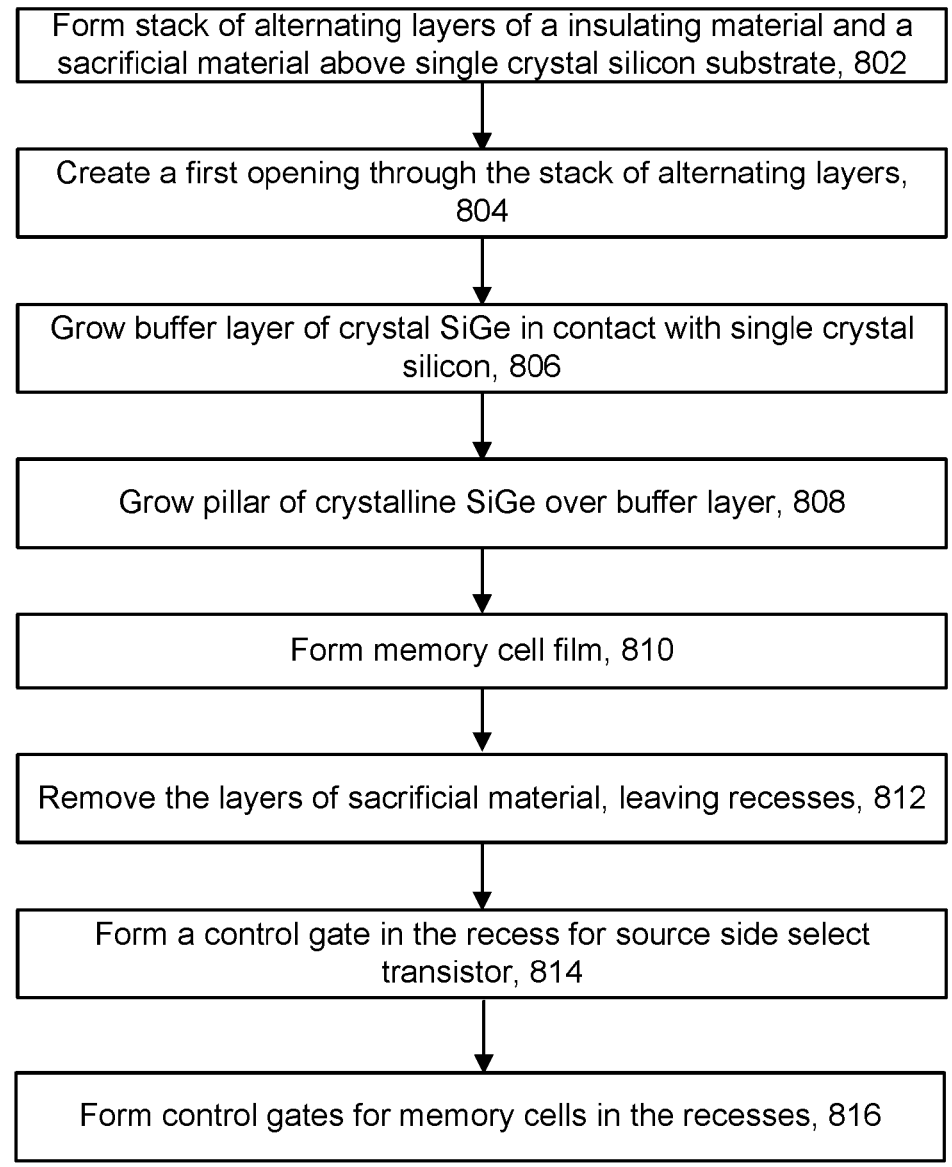
FIG. 8 is a flowchart of one embodiment of a process of fabricating a 3D memory array.

FIG. 8 is a flowchart of one embodiment of a process 800 of fabricating a 3D memory array. Process 800 is used to form a select transistor select having a body comprising single crystal silicon germanium in contact with a crystalline silicon substrate. Also formed is a string of memory cells having a string channel comprising silicon germanium in contact with the single crystal silicon germanium of the select transistor body. The process 800 may be used to fabricate devices such as, but not limited to, those depicted in FIGS. 3, 4C, 5A-5C, 6 and 7. Note that not all process steps are described. For example, some etching, cleaning, doping, and/or annealing steps may be omitted.

Step 802 includes forming a stack of layers of material above a crystalline silicon substrate. The substrate may be single crystal silicon. The crystalline silicon substrate may have a major plane that extends in a horizontal direction. The major plane may extend in the x/y-plane, as depicted in FIGS. 3, 4C, 5A-5C, 6 and 7, for example. The layers of material may extend in the horizontal direction with respect to the major plane of the substrate.

The layers of material may include alternating layers of a first material and a second material. These two materials have an etch selectivity with respect to one another, in one embodiment. One material could be the dielectric of dielectric layers DL0-D57 in FIG. 4C. However, rather than depositing the conductive layers (e.g., SGS, DWLL2a, DWLL2b, WL0-WL47, DWLL1b, DWLL1a, SGD3-SGD0) a sacrificial material may be deposited instead. For example, silicon oxide could be deposited for dielectric layers DL0-D57, and silicon nitride for sacrificial layers.

Step 804 includes creating a first opening through the stack of alternating layers of the first and second material. This first opening may be referred to as a "memory hole", as it may be used to form memory cells therein. Note that many such memory holes can be formed in the stack of alternating layers. The first opening could correspond to any of the columns that are depicted in FIG. 4B-4C, 5A-5C, or 6. The first opening may extend vertically through the layers of the first and second materials down to the crystalline silicon substrate, as one example. The first opening may extend partway into the crystalline silicon substrate.

Step 806 includes growing a buffer layer of crystalline SiGe in direct contact with the crystalline silicon substrate. The buffer layer is in direct contact with a single crystal silicon portion of substrate 201. Note that when the term "single crystal silicon substrate" is used herein it will be understood that the silicon substrate 201 is single crystal silicon at least where the SiGe body 506 is in direct contact with the silicon substrate 201. However, it is possible for the silicon substrate 201 to have different crystalline orientations in other regions.

In one embodiment, the precursors in step 806 are $GeH_4$, $SiH_4$, and $SiCl_2H_2$. The concentration of germanium is graded, in one embodiment. The concentration of germanium increases during growth of the buffer layer, in one embodiment. Thus, the concentration of germanium may increase with distance from the single crystal silicon substrate. In one embodiment, the buffer layer is "silicon rich", by which is meant that x is less than 0.5 in $Si_{1-x}Ge_x$. The buffer layer is 10 nanometers or less, in one embodiment. However, the buffer layer could be thicker than 10 nanometers.

Step 806 includes epitaxial growth of the buffer layer, in some embodiments. The single crystal silicon substrate 201 may act as a seed crystal, wherein the buffer layer of crystalline SiGe locks into one or one crystallographic orientations with respect to the single crystal silicon substrate.

Figure 11:
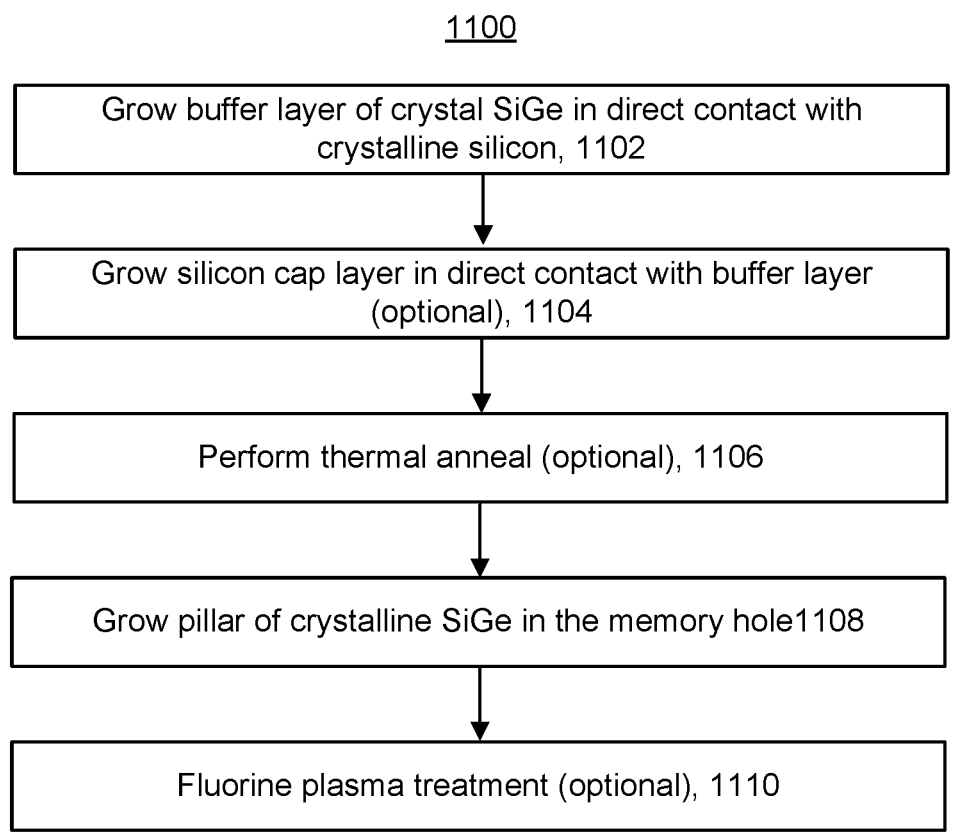
FIG. 11 is a flowchart that provides additional details for one embodiment of a process of forming the epitaxial SiGe body.

Step 808 includes growing a solid pillar of crystalline SiGe over the buffer layer. This is a single crystal of SiGe, in some embodiments. This is epitaxial growth in some embodiments. In one embodiment, the precursors are $GeH_4$, $SiH_4$, and $SiCl_2H_2$. In one embodiment, the solid pillar of crystalline silicon germanium comprises $Si_{1-x}Ge_x$, wherein x is greater than 0.5 throughout the solid pillar. The solid pillar of crystalline SiGe might or might not be in direct contact with the buffer layer. In one embodiment, a silicon cap layer is formed over the buffer layer prior to forming the solid pillar of crystalline SiGe. FIG. 11 provides further details of the silicon cap layer.

As noted, step 808 includes epitaxial growth of the solid pillar of crystalline SiGe, in some embodiments. The buffer layer may act as a seed crystal, wherein the solid pillar of crystalline SiGe locks into one or one crystallographic orientations with respect to the buffer layer. Thus, a solid pillar of single crystal SiGe may be aligned into one or one crystallographic orientations with respect to the single crystal silicon substrate 201.

Together, steps 806 and 808 are one embodiment of, epitaxially forming a select transistor body comprising single crystal silicon germanium in contact with the crystalline silicon substrate.

Step 810 includes forming a memory cell film in the memory hole. Step 810 may include forming successive conformal layers of thin film. In one embodiment, layers such as depicted in FIGS. 5A, 5C, and 6 are formed in the memory hole. For example, a layer of $SiO_2$ is formed for a blocking layer 478, followed by a layer of silicon nitride for a charge trapping layer 473, followed by layers of silicon oxide, silicon nitride and silicon oxide (ONO) for tunneling dielectric 472. Formation of these layers can be implemented with atomic layer deposition (ALD), chemical vapor deposition (CVD), but is not so limited.

An etching step may then be performed to expose the solid pillar of crystalline SiGe at the bottom of the memory hole. This may be followed by forming silicon germanium for semiconductor channel 471. Formation of the silicon germanium can be implemented with atomic layer deposition (ALD), chemical vapor deposition (CVD), but is not so limited. A core of silicon oxide may then be formed for inner core 470. Further details of one embodiment are desorbed in connection with FIG. 9.

Step 812 includes removing the layers of sacrificial material, leaving recesses.

Step 814 includes forming a control gate for the source side select transistor in one of the recesses. Step 816 includes forming control gates for the memory cells in the recesses. In one embodiment, the control gates of the source side select transistor and the memory cells are made from a combination of TiN and Tungsten. In other embodiments, other materials can be used to form the control gates, such as doped polysilicon, metal such as Tungsten or metal silicide.

FIG. 9 is a flowchart of one embodiment of a process 900 of forming NAND strings in a 3D memory array. The process 900 provides further details of one embodiment of the process 800 of FIG. 8. FIGS. 10A-10H depict results after various steps of one embodiment of the process of FIG. 9. FIGS. 10A-10H depict an example similar to the embodiment of FIG. 4C.

In FIG. 9, steps need not necessarily be performed as discrete steps in the order indicated. Various modifications can be made. Moreover, other steps which are known from the art of semiconductor fabrication but are not explicitly depicted here may also be performed. FIG. 9 represents a "word line last" technique in which the word lines are formed after forming the NAND strings. For example, after forming the NAND strings, sacrificial silicon nitride may be replaced, at least in part, with metal.

Prior to process 900, below-stack circuitry and metal layers may be formed in the substrate 201. Various circuits may be formed in the crystalline silicon substrate 201. For example, a metal layer M0 can be used, e.g., for power line and global control signals, and a metal layer M1 can be used, e.g., for bit line and bus signals. In some cases, to make signal routing easier and to save area, a third metal (M2) can also be used, e.g., a total of three (or more) metal layers under the array. The metal layers can be fabricated from a patterned metal film. For example, aluminum can be used for the top metal layer, while the other layers are tungsten. Potentially, copper can be used instead of aluminum for upper layer, using a corresponding integration scheme. For silicidation, Ni, Ti, Co or W can be used, for instance. Note that it is not required to form circuits in the crystalline silicon substrate 201. Also, at least some of the circuits can be formed over top of the array after process 900 is complete. For example, the aforementioned metal layers M0, M1 and optionally, M2 can be formed over the memory array.

Step 902 includes depositing alternating silicon oxide ($SiO_2$)/silicon nitride (SiN) layers above the crystalline silicon substrate 201. The silicon nitride is a sacrificial layer, which will be replaced in part by material to form a portion of the blocking layer and in part by metal to form word lines (as well as a source select line (SGS), and a drain select line (SGD or SG). The silicon oxide will be used for the insulating layers between the metal word (and select) lines. Other insulators could be used instead of silicon oxide. Other sacrificial materials could be used instead of silicon nitride. Step 902 is one embodiment of step 802 from process 800 of FIG. 8, which is forming horizontal layers above a semiconductor substrate.

Step 904 includes etching slits in the alternating silicon oxide ($SiO_2$)/silicon nitride (SiN) layers. Step 906 includes filling in the slits with insulation. Note that later in process 900 at least a portion of this insulation will be removed. These slits may eventually be used as the second openings referred to in process 800. Thus, these slits can have a shape similar to the local source lines 344 depicted in FIG. 3. Note that such slits could extend for the entire length of a block.

Step 908 includes etching memory holes (MH) in the alternating layers of silicon nitride and silicon oxide. Reactive ion etching can be used to etch the memory holes. In the memory array area, the memory holes are placed densely. For example, the memory holes can have a diameter of 70-110 nanometers (nm) ($70-110\times10^{-9}$ meters). This is an example range; other ranges could be used. Also note that the diameter could vary from top to bottom. Step 908 is one embodiment of step 804 from process 800 of FIG. 8.

FIG. 10A shows results after one embodiment of step 908. FIG. 10A shows sacrificial layers (SAC0-SAC6 and SAC56) alternating with insulating layers (DL0-DL7 and DL57) in a stack 1000 over a crystalline silicon substrate 201. As noted above, there may be more or fewer layers than in this example. Sacrificial layers SAC7 through SAC55 are not depicted in FIG. 10A. Insulating layers DL8 through DL56 are not depicted in FIG. 10A. FIG. 10A is consistent with formation of the device of FIG. 4C, which shows two memory holes 432, 434, and two source lines 344b, 344c. The two vertical memory holes (MH) in FIG. 10A correspond to memory holes 432, 434. In FIG. 10A, regions 1002a, 1002b are where insulation has been used to fill the slits. The source lines 344b, 344c will eventually be formed in regions 1002a, 1002b.

The sacrificial layers are silicon nitride (SiN) in this embodiment and will eventually be layers SGS, DWLL2a, DWWL2b, WLL0-WLL47, DWLL1b, DWWL2a, SGD3, SGD2, SGD1, and SGD0 (note that the aluminum oxide layer 477 may also be formed in the region vacated by the sacrificial layers in one embodiment). The insulating layers are silicon oxide in this embodiment. The two memory holes (MEI) are depicted as extending vertically through the alternating sacrificial layers and insulating layers. The memory holes extend down into the crystalline silicon substrate 201. Etching the memory holes could etch partway into the crystalline silicon substrate 201, as depicted in FIG. 10A. An x-y-z coordinate system is depicted, showing the direction of formation. The memory holes each have a major axis that is parallel to the z-axis.

Figure 10B:
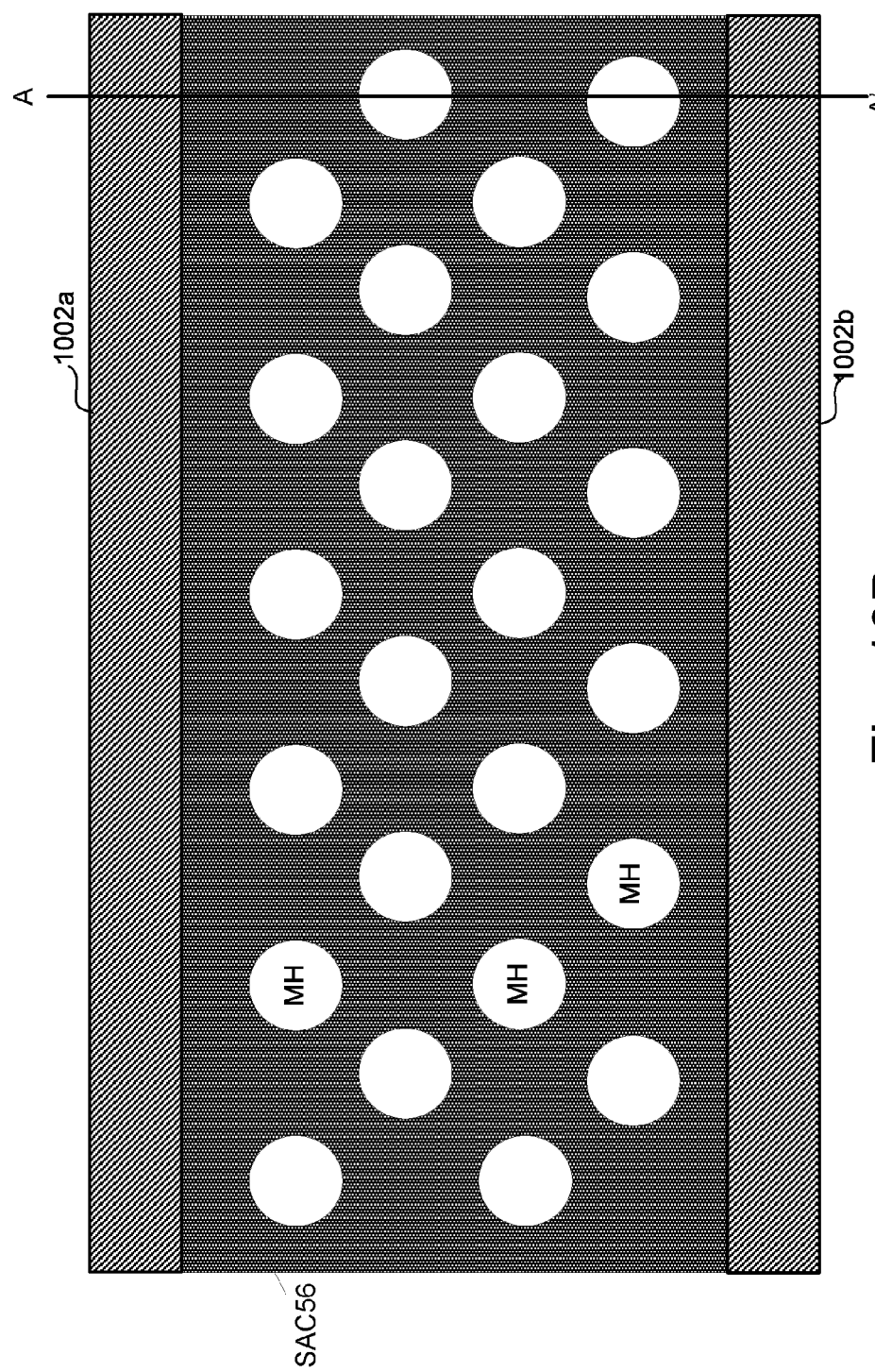

FIG. 10B shows a cross sectional view of sacrificial layer SAC56 from FIG. 10A after step 1008, showing one possible pattern for the memory holes (MH). This is not the only possible pattern. For example, the memory holes do not need to be staggered as depicted. An x-y-z coordinate system is depicted, showing the direction of formation. Note that line A-A' indicates that FIG. 10A is a cross section along line A-A' of FIG. 10B. Also note that the memory holes have a circular cross section in the horizontal direction (e.g., x-y plane), in this example. The memory holes are not required to be circular in cross section. Note that the memory holes could be of different diameter in the different layers. For example, the memory holes could have a smaller diameter at the lower layers. FIG. 10B shows that the insulation filled slits 1002a, 1002b extend in the x-direction.

Step 910 includes epitaxial growth of SiGe at the bottom of the memory holes for the source side select transistor bodies 506. Step 910 includes forming epitaxial SiGe at the bottom of the memory holes, in one embodiment. Step 910 is one embodiment of step 806 from process 800. Step 910 results in forming a body 506 of a source side select transitory comprising epitaxial crystalline silicon germanium (SiGe) in contact with the single crystal silicon substrate 201.

Figure 10C:
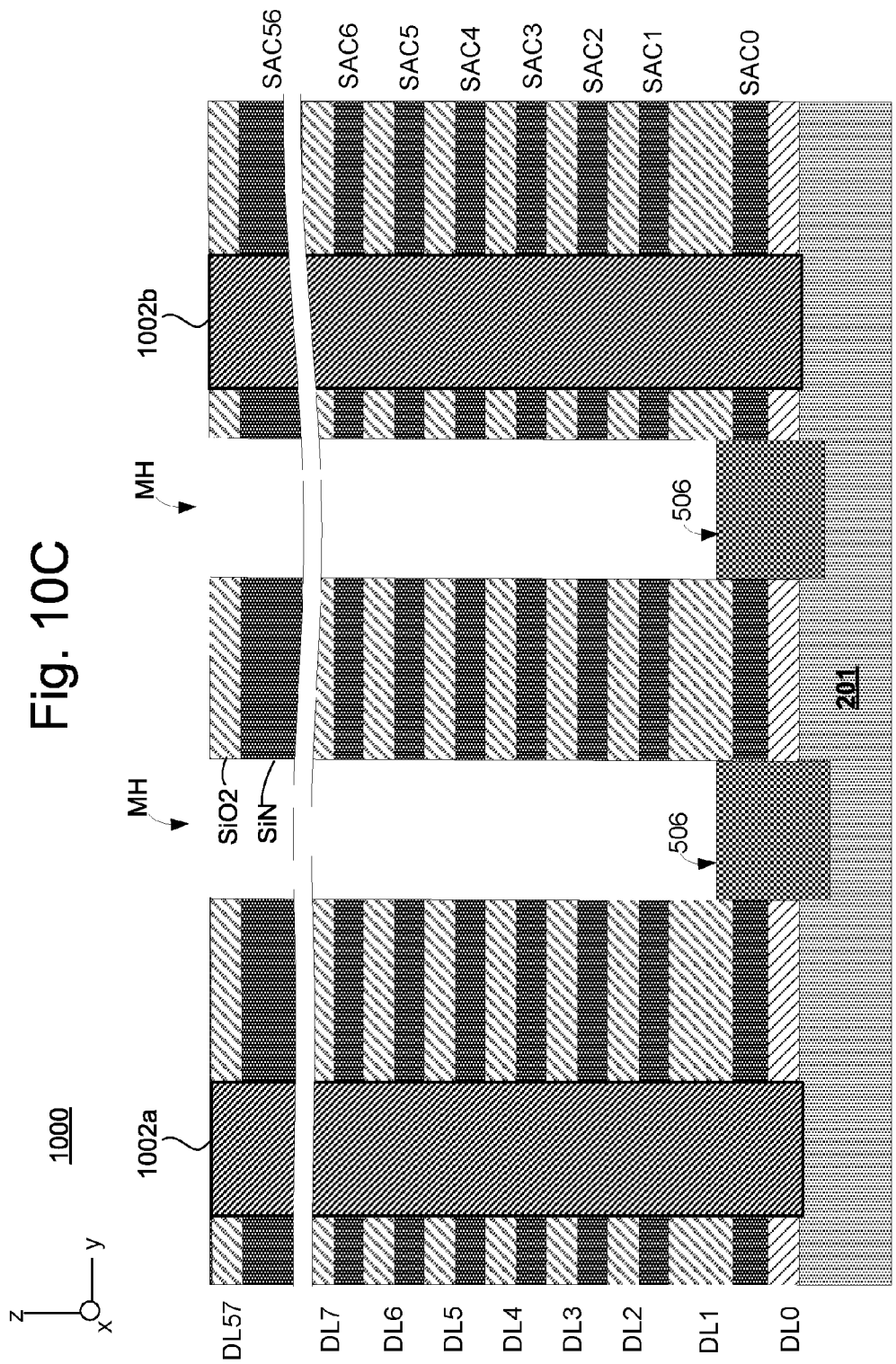

FIG. 10C depicts results after step 910, showing epitaxially formed silicon germanium in the bottom of the memory holes (MH). Note that epitaxially formed SiGe will serve as the body 506 of the source side select transistor, and hence is referenced in FIG. 10C accordingly. The epitaxially formed SiGe 506 may cover the vertical sidewalls of the memory holes near the bottom (e.g., at DL0, sacrificial layer SAC0, and part of DL1). The epitaxially formed SiGe 506 is in direct contact with the single crystal silicon substrate 201, in one embodiment. FIG. 11 provides further details of one embodiment of step 910.

Step 912 is depositing a dielectric in the memory holes for at least a portion of the blocking layer. This may be deposited as a conformal layer over vertical sidewalls of the memory holes, as well as over the epitaxially formed SiGe 506. In one embodiment, step 912 includes depositing a conformal layer of $SiO_2$ over vertical sidewalls of the memory holes. The $SiO_2$ may also cover the top of the epitaxially formed SiGe 506.

Note that in some embodiments a portion of the blocking layer is formed outside of the memory holes. For example, referring back to FIGS. 5A and 6, an aluminum oxide layer 477 exists outside the memory holes. However, another option is to form aluminum oxide layer 477 within the memory holes.

Step 914 is depositing the charge trapping layer (CTL) 473 in the memory holes. In one embodiment, a nitride such as SiN be deposited as a charge trapping layer 473. This may be deposited as a conformal layer over the blocking layer. The charge trapping layer 473 can be formed, for example, by chemical vapor deposition (CVD), atomic layer deposition (ALD), physical vapor deposition (PVD), or any suitable deposition technique.

Step 916 is depositing at least one of the layers of the tunnel dielectric 472 in the memory holes. The tunnel dielectric 472 may be deposited as a conformal layer on the charge trapping layer 473. Thus, the tunnel dielectric 472 may cover vertical sidewalls of the charge trapping layer 473, as well as the portion of the charge trapping layer 473 that is on the epitaxially formed SiGe 506. The tunnel dielectric 472 can be formed, for example, by chemical vapor deposition (CVD), atomic layer deposition (ALD), physical vapor deposition (PVD), or any suitable deposition technique.

Step 916 may include depositing multiple layers, such as $SiO_2$ and SiON, with the $SiO_2$ nearest the charge trapping region (e.g., SiN). The tunnel dielectric might also include $SiO_2$ and ISSG (in-situ steam generation) formed oxide, with the $SiO_2$ nearest the charge trapping region. The tunnel dielectric might also include three layers: $SiO_2$, SiON, and ISSG formed oxide.

Step 918 is to deposit a protective layer over the tunnel dielectric layers. In one embodiment, a layer of silicon oxide is deposited. This may be deposited using CVD or ALD, as two examples. The silicon oxide may be about 5 nm in thickness. However, it could be thicker or thinner. The protective layer may serve to protect the tunnel dielectric during later etching steps.

Step 920 includes etching at the bottom of the memory holes to expose the epitaxially formed SiGe 506. In one embodiment, this is a reactive ion etch (ME). Step 920 may include one or more anisotropic etch processes to sequentially etched various layers. The etch may include zero or more isotropic etch processes and zero or more anisotropic etch processes.

Step 922 is a post wet etch clean. This step removes the protective layer (from step 918). In one embodiment, a wet etch is used to remove the silicon oxide protective layer. Also polymer residues from the etch of step 920 are etched away.

Figure 10D:
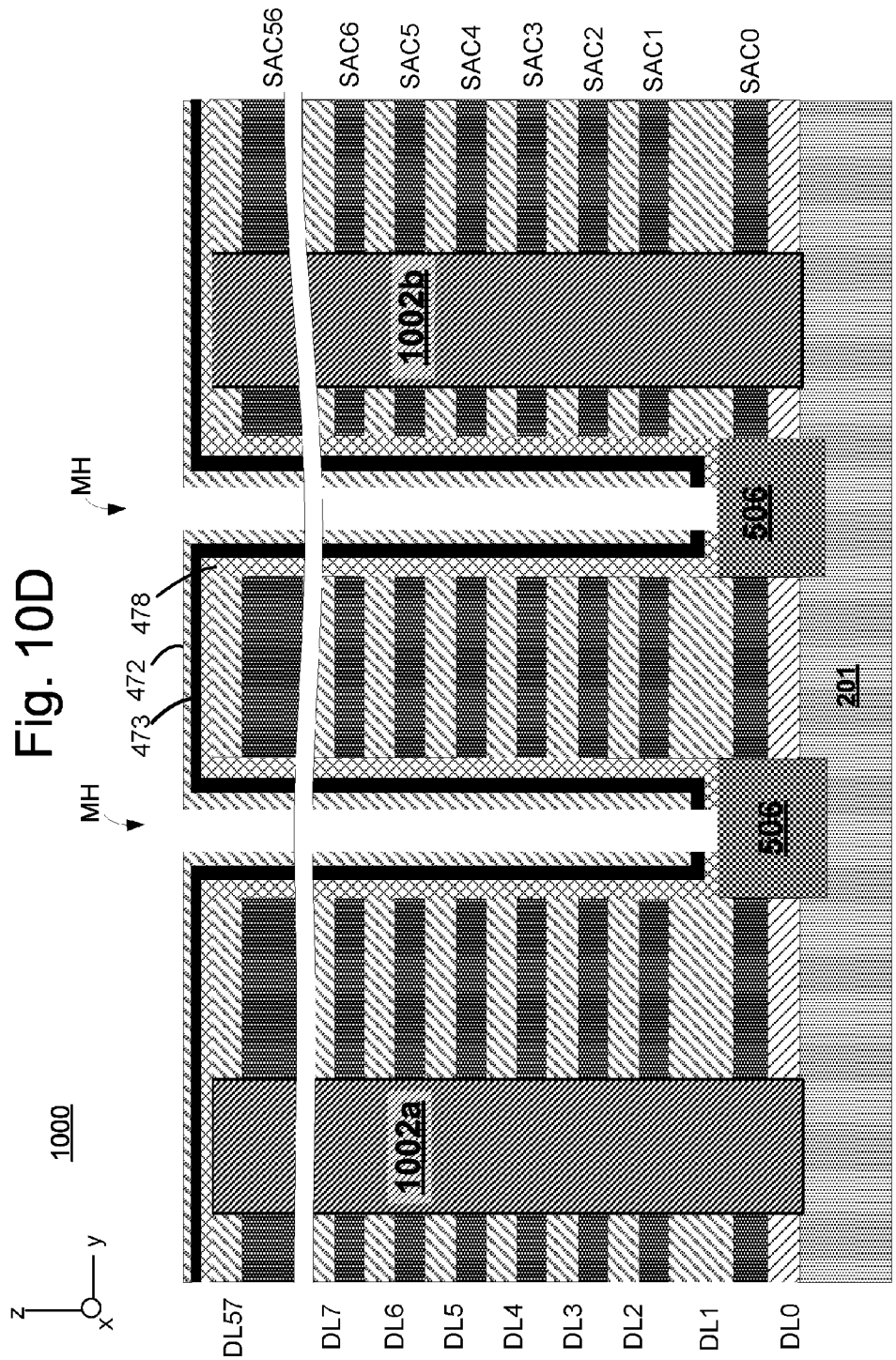

FIG. 10D shows results after step 922. The etching has created a gap in the memory cell film at the bottom of the memory holes to expose the top of epitaxially formed SiGe 506. The etching has gone through the horizontal portion of tunnel dielectric layer(s) 472, through horizontal portion of the charge trapping layer 473, and through horizontal portion of the silicon oxide 478 at the bottom of the memory holes.

Step 924 is to form a silicon germanium layer in the memory holes for the channel of the memory cells (i.e., for the NAND string channel). The silicon germanium layer can be formed by a conformal deposition method such as low pressure chemical vapor deposition (LPCVD). The thickness of the silicon germanium layer can be in a range from 5 nm to 15 nm, although lesser and greater thicknesses can also be employed. The silicon germanium layer may partially fill the cavity in each memory opening, or may fully fill the cavity in each memory opening.

In one embodiment, the germanium concentration is graded. For example, the germanium concentration varies in the radial direction. In one embodiment, the concentration of germanium increases in a direction away from the tunneling dielectric 472. In one embodiment, the precursors in step 924 include $GeH_4$, $SiH_4$, and $SiCl_2H_2$. This allows for formation of $Si_{1-y}Ge_y$, where "y" could be constant throughout the NAND channel or could vary. In one embodiment, "y" increases with distance from the memory cell tunnel dielectric formed in step 916. In one embodiment, the value of "y" in the $Si_{1-y}Ge_y$ in the NAND channel is equal to the value of "x" in the crystalline $Si_{1-x}Ge_x$ body 506 of the source side select transistor. This provides for good alignment of conduction bands of the source side select transistor body 506 and the NAND channel. It also provides for good alignment of respective valence bands.

Step 926 is an optional step of forming a dielectric core inside of the SiGe channel. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating.

Certain of the steps of process 900 form a memory cell film in the memory holes. For example, steps 912, 914, 916, and 924 are one embodiment of forming a memory cell film in memory holes.

Figure 10E:
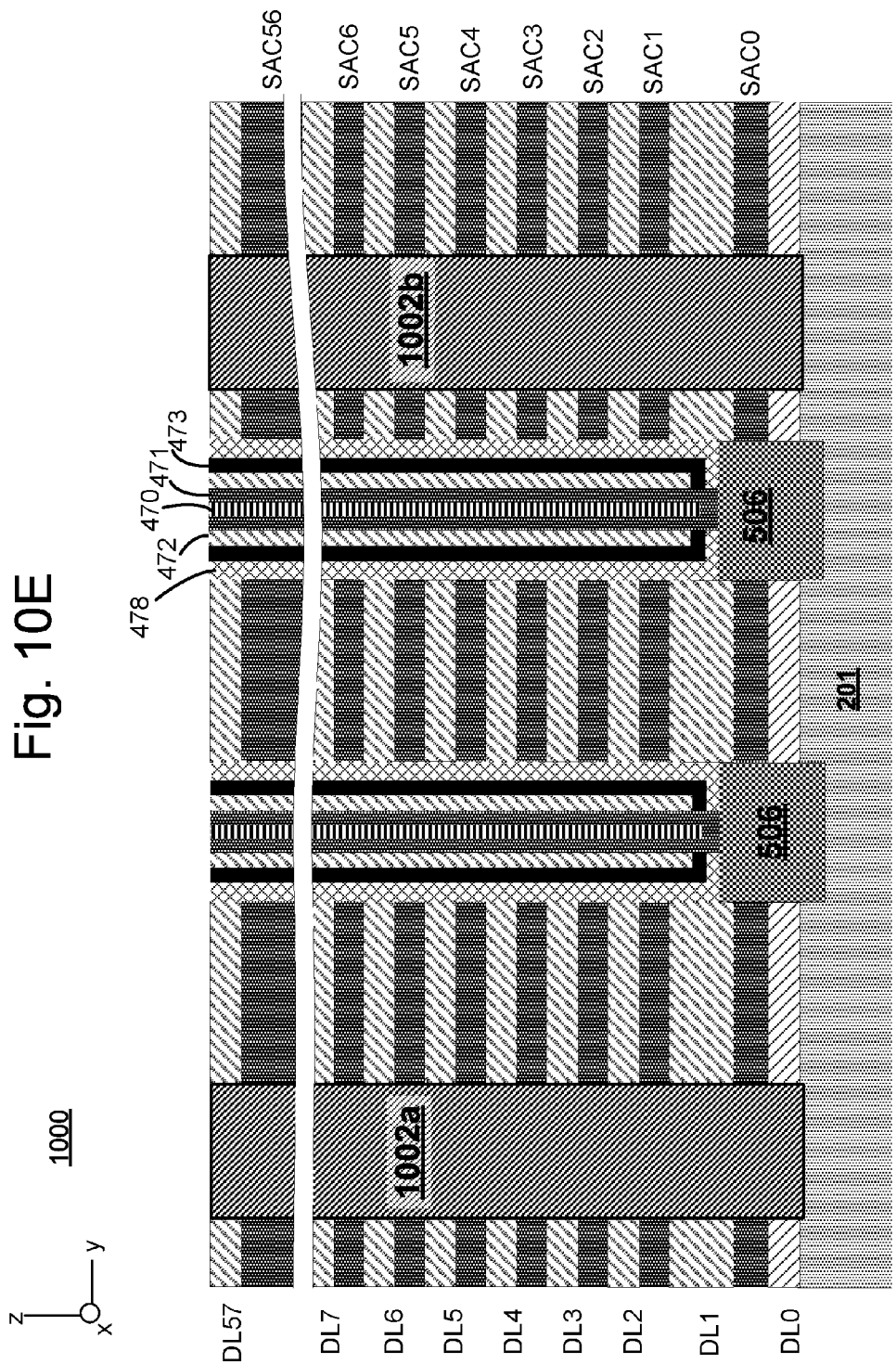

Step 928 is to remove a portion of the memory film outside of the memory holes. The horizontal portion of various layers can be removed, for example, by a recess etch or a chemical mechanical planarization (CMP). Optionally, an n-type dopant can be implanted in the drain end of the silicon germanium channel. This creates an n+ region at the drain end that reduces contact resistance with a bit line contact, in one embodiment. FIG. 10E depicts results after step 928. FIG. 10E shows the addition of the silicon germanium channel 471 and optional core dielectric 470 in the memory holes.

Step 930 is to etch the slits 1002. This removes the material that was in the slits and is done to allow removal of the sacrificial silicon nitride and to deposit metal.

Step 932 includes performing an etch via the slits to remove portions of the silicon nitride layers. The etch can involve introducing an etchant via the slits, which has a higher selectivity for the silicon nitride, removing the silicon nitride layers. The wet etch is not relatively highly selective of the silicon oxide so that the silicon oxide is not substantially removed. The etch may have a relatively higher selectivity (e.g., by a factor of 1000, or more generally, 100 or more) for the silicon nitride relative than for the silicon oxide. Also note that the etch should not remove the NAND strings. Step 932 is one embodiment of step 812 from process 800.

The wet etch should remove essentially the entire silicon nitride layers wherein the NAND strings are being formed (memory cell area), so that when the regions of the removed silicon nitride are replaced in at least part by metal, the metal will extend in substantially the entire layer in the memory cell area. Thus, word line layers at different levels should be isolated from one another and not shorted together. This applies regardless of the etch method, e.g., whether the etchant is introduced via the slits, memory holes, other holes or voids, or combinations thereof. The NAND strings in the memory holes serve as anchors which support the silicon oxide layers when the silicon nitride is removed by etching through slits.

A variety of etching techniques may be used to etch the silicon nitride. Nitride can be etched in one embodiment, by heated or hot phosphoric acid ($H_3PO_4$). As an example, the boiling point of phosphoric acid varies with the concentration of the acid. For example, for a range of acid concentration between 79.5%-94.5% the boiling point may vary from 140° C.-200° C. The etch rate of silicon nitride varies with the temperature and the concentration of the acid. Since the bath is operated at high temperature, water readily evaporates from the solution and the concentration of phosphoric acid changes. Therefore, this may be considered to be a type of "wet" etch. However, a wet etch is not necessarily needed for nitride, as other etching techniques may be applied. In other embodiments, the sacrificial material in the stack may be something other than silicon nitride. Therefore a different type of etch process and etchant may be used.

Figure 10F:
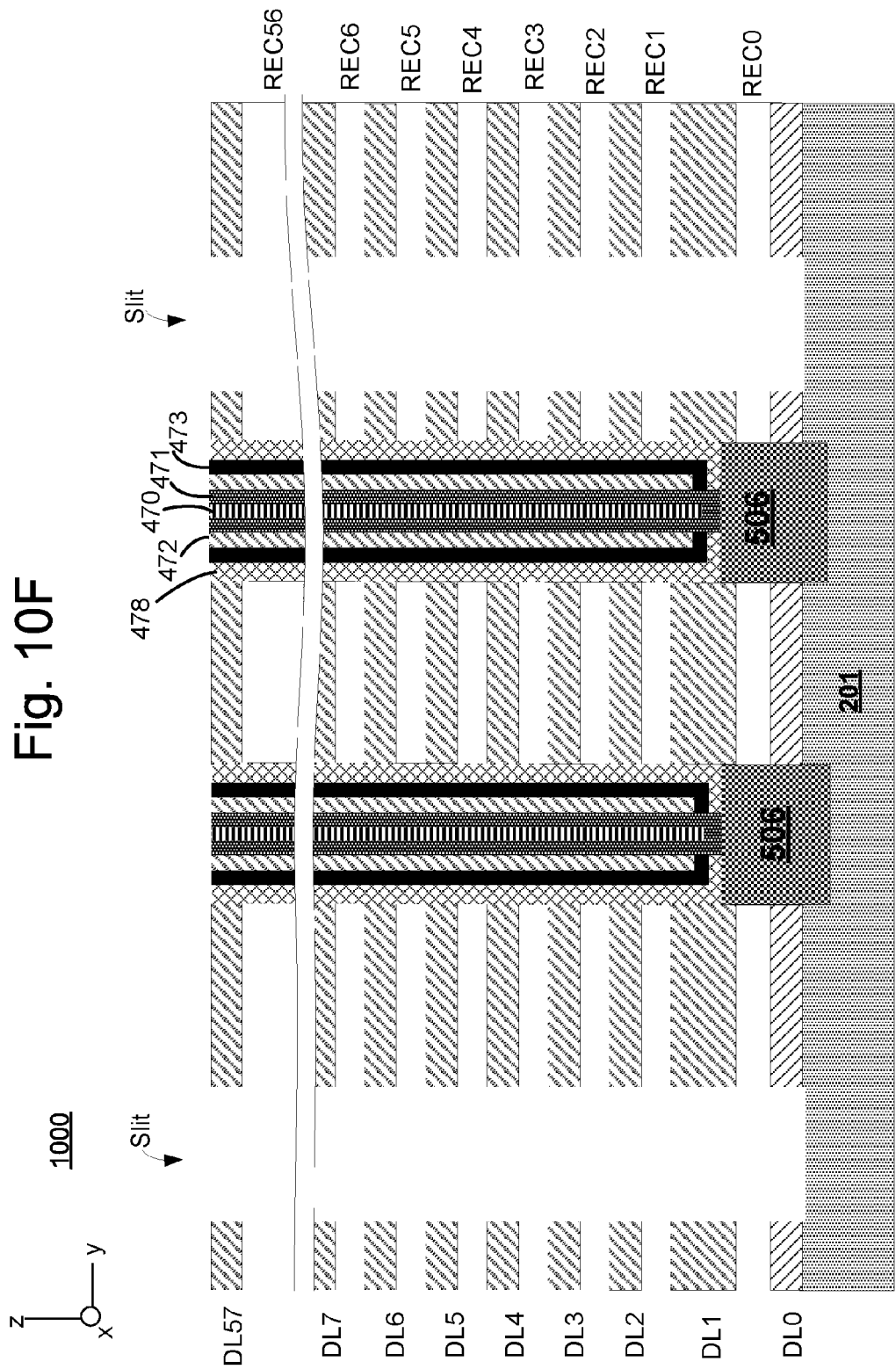

FIG. 10F depicts results after one embodiment of step 932. FIG. 10F shows that the insulation has been removed from the slits. Also, the silicon nitride in the sacrificial layers has been removed leaving horizontal recesses where the sacrificial layers previously were. The material in the memory holes may serve as an anchor to hold the dielectric layers in place. What were sacrificial layers (SAC0-SAC56) are now labeled recess layers (REC0-REC56).

In step 934, an impurity is introduced into the slits to dope the substrate 201 below the slits. An example impurity for the n+ region is Arsenic. An example doping concentration for the n+ region is $1 \times 10^{20}/cm^3$.

Figure 10G:
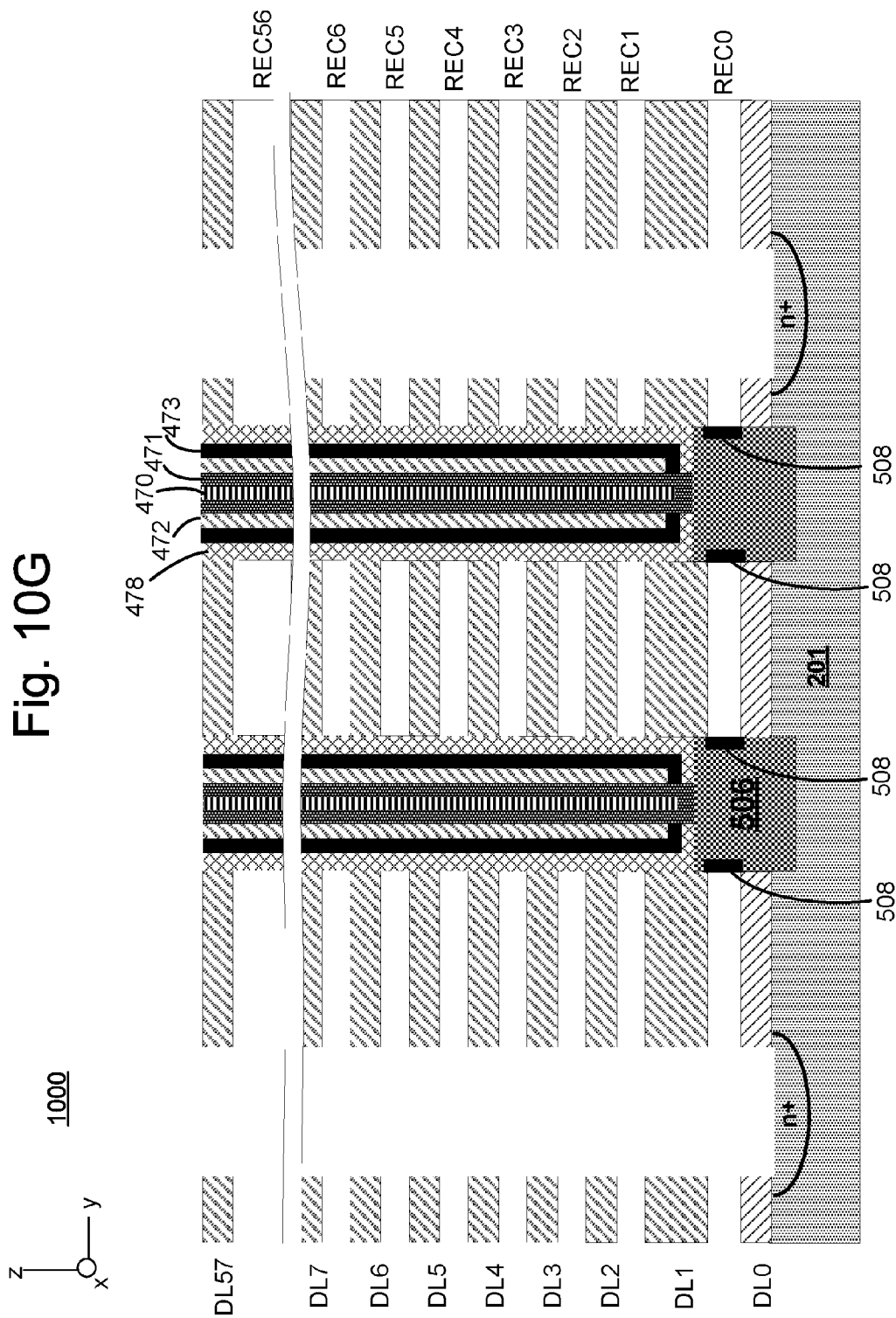

Step 938 is an optional step of forming a gate dielectric for the source side select transistors. Step 938 may include oxidation of sidewalls of the SiGe region 506 to form gate oxides. Step 938 includes a water vapor generator (WVG) oxidation process, in one embodiment. FIG. 10G depicted results after one embodiment of step 938. A gate dielectric region 508 is depicted on sidewall of the SiGe region 506.

Step 938 may include converting a surface portions of the SiGe 506 into a SiGe oxide portion, a SiGe nitride portion, or a SiGe oxynitride portion by oxidation, nitridation, or a combination of oxidation and nitridation, of the physically exposed portions of the SiGe region 506. The gate dielectric 508 may laterally surround a respective SiGe region 506.

In optional step 940, a portion of the blocking layer is formed in the recesses. This portion of the blocking layer is an $Al_2O_3$ layer, in one embodiment. This portion of blocking layer may be deposited by ALD from outside of the memory hole through the slits.

Step 942 includes depositing metal (e.g., one or more layers) in the recesses via the slits. In one embodiment, the metal is tungsten. This forms a metal/oxide stack. Metal is provided in the slits to fill the recesses left when the sacrificial material was removed. Chemical vapor deposition (CVD) or atomic layer deposition (ALD) could be used to deposit the metal. Step 942 is one embodiment of step 814 from process 800.

Step 944 is forming material in the slits for the local source lines (also referred to as local interconnects). Step 944 may include depositing an insulating layer in the slits to cover vertical sidewalls of the slits. Initially, the insulating layer may also cover the substrate at the bottom of the slits. The insulating layer in a slit may be etched to create an opening for the source line. The substrate 201 is exposed as a result of etching the insulating layer, in one embodiment. Step 944 may include depositing one or more conductive fill materials in the slits. The conductive fill materials serve as the source lines. For example, a first conductive fill material can include a doped semiconductor material such as doped polysilicon. The first conductive fill material might be used in the lower portion of the slits. A second conductive fill material can include at least one metallic material such as a combination of a conductive metallic nitride material (such as TiN) and a metal (such as W, Co, or Ru). Step 944 may also include one or more etching steps to remove excess fill material (for both the first and second fill material).

Figure 10H:
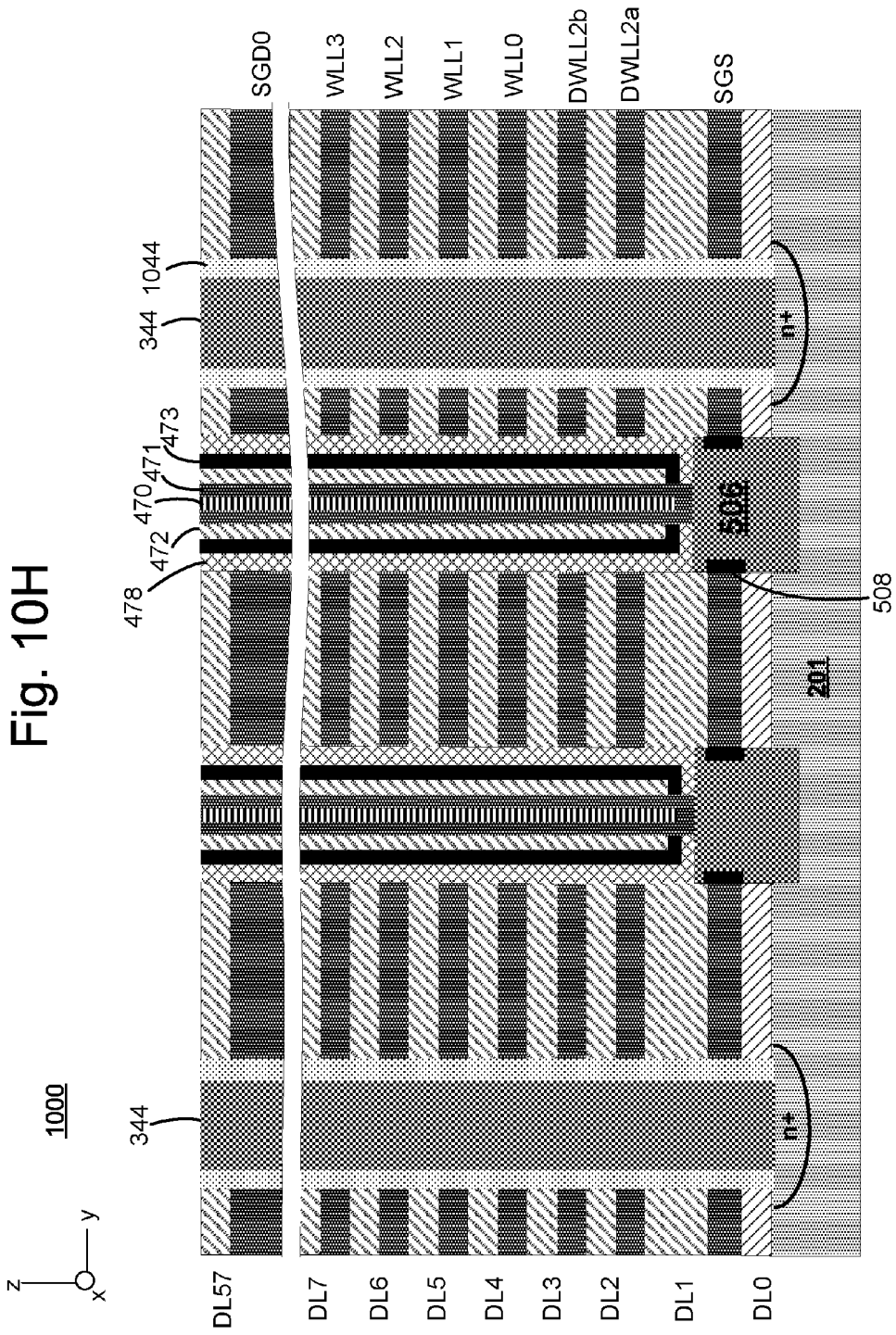

FIG. 10H depicts results after one embodiment of step 944. The recesses in the stack have been filled with a conductive material. Thus, the recess layers are re-labeled as SGS, DWLL2a, DWLL2b, WLL0, WLL1, WLL2, WLL3, and SGD0. As the aluminum oxide layer was described as being optional, it is not depicted in FIG. 10H. However, in one embodiment, there is an aluminum oxide layer 477 outside of the memory holes, as in FIG. 4C.

The source lines 344 are now formed in the slits. An insulating layer 1044 provides electrical insulation between the source lines 344 and the conductive layers (SGS, DWLL2a, DWLL2b, WLL0, WLL1, WLL2, WLL3, and SGD0).

In step 946, bit line contacts are formed. The bit line contacts are formed from heavily n-doped silicon, in one embodiment. After step 946, additional steps may be performed to for, source line contacts, bit lines, global source lines, etc.

FIG. 11 is a flowchart that provides additional details for one embodiment of a process 1100 of forming the epitaxial SiGe body 506. Process 1100 may be used in one embodiment of step 910 of process 900. However, note that step 910 is not limited to process 1100. Also, process 1100 may be used during steps 806 and 808 of process 800. However, steps 806 and 808 are not limited to process 1100. FIGS. 12A-12D depict results after various steps of one embodiment of the process of FIG. 11.

Step 1102 includes growing a buffer layer of crystalline SiGe in direct contact with the single crystal silicon substrate. In one embodiment, the precursors are $GeH_4$, $SiH_4$, and $SiCl_2H_2$. The concentration of germanium is graded, in one embodiment. The concentration of germanium increases during growth of the buffer layer, in one embodiment. Thus, the concentration of germanium may increase with distance from the crystalline silicon substrate. In one embodiment, the buffer layer is "silicon rich", by which it is meant that x is less than 0.5 in $Si_{1-x}Ge_x$. In one embodiment, x is between 0.1 to 0.5 in the buffer layer.

The buffer layer is 10 nanometers or less, in one embodiment. However, the buffer layer could be thicker than 10 nanometers.

Note that there could be a lattice mismatch between the single crystal silicon substrate and the crystalline SiGe transistor body. The buffer layer has almost the same lattice constant as the single crystal silicon substrate, in some embodiments. Thus, the lattice mismatch can be reduced or prevented. Moreover, defect can be reduced or eliminated.

Figure 12A:
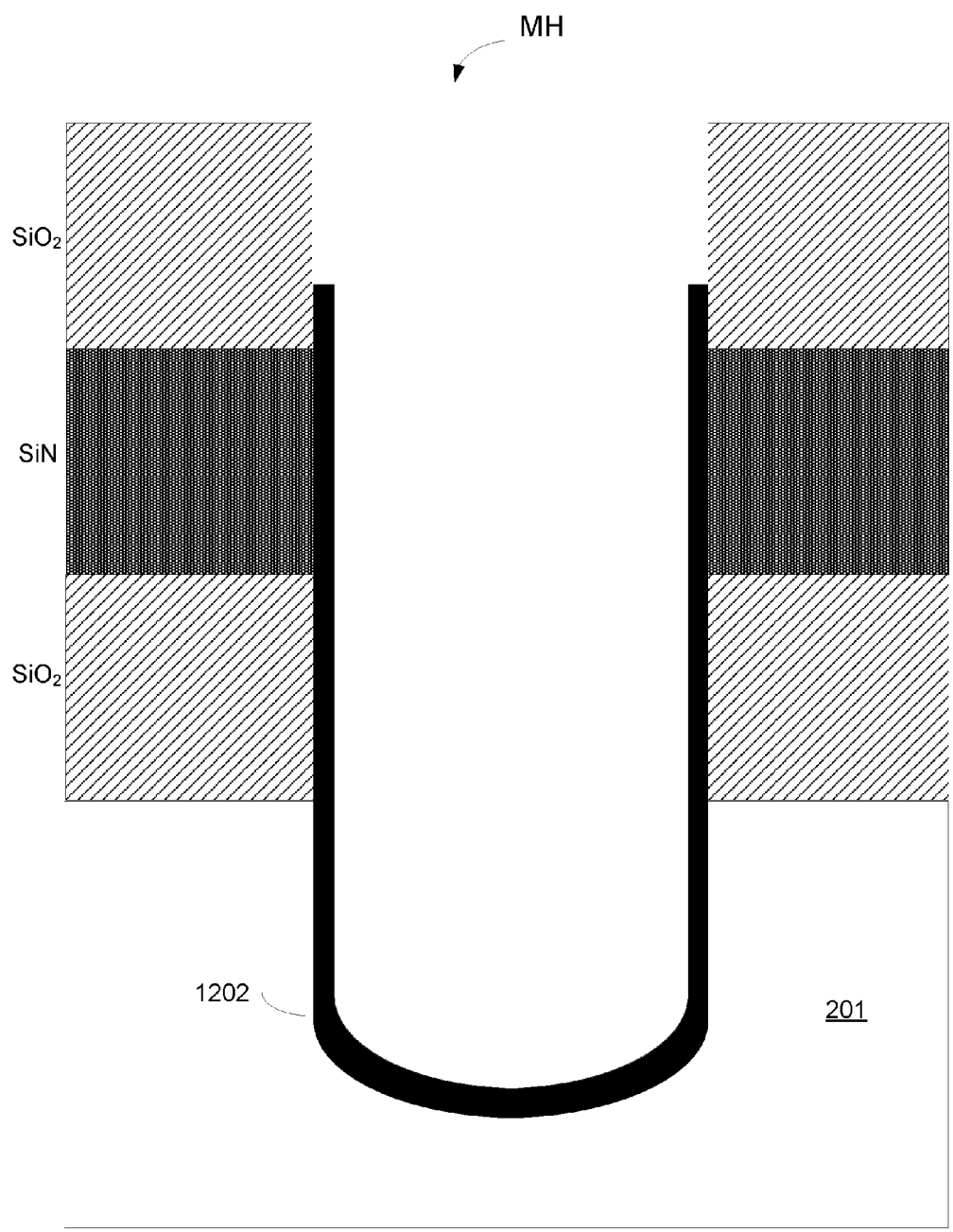
FIGS. 12A-12D depict results after various steps of one embodiment of the process of FIG. 11.

Results after one embodiment of step 1102 are depicted in FIG. 12A. FIG. 12A shows a memory hole (MH) formed in alternating layers of silicon nitride (SiN) and silicon oxide ($SiO_2$). The silicon oxide ($SiO_2$) layers correspond to layers DL0 and DL1 in FIG. 10C. The silicon nitride (SiN) layer corresponds to SAC0 in FIG. 10C. The memory hole extends partway into the substrate 201, which is single crystal silicon, in this embodiment. The buffer layer 1202 is depicted in the memory hole. The buffer layer 1202 is in direct contact with the single crystal silicon substrate 201.

Figure 12B:
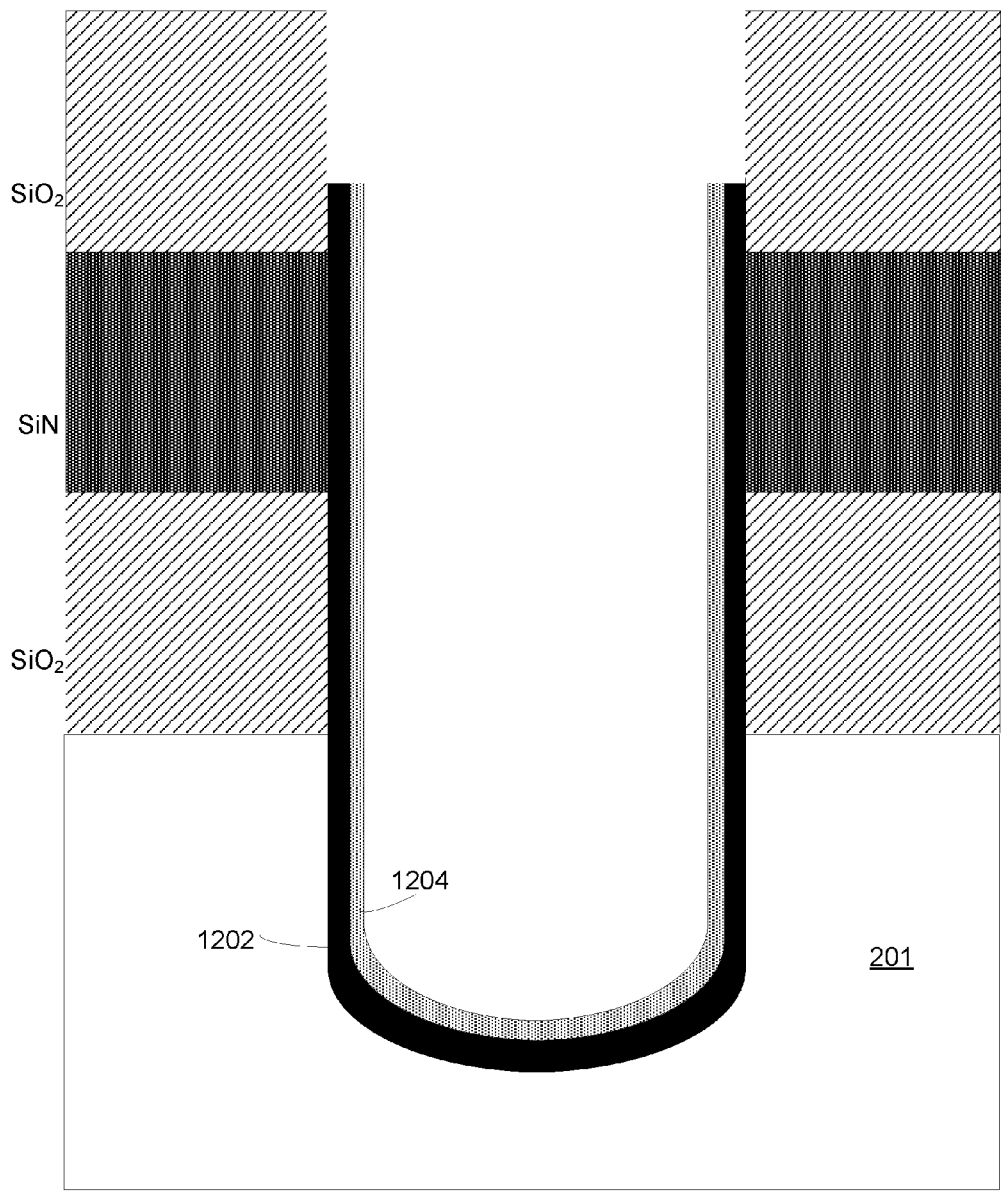

Optional step 1104 includes forming a silicon cap layer in direct contact with the buffer layer. The silicon cap layer is epitaxial growth, in some embodiments. Results after step 1104 are depicted in FIG. 12B. The silicon cap layer 1024 is depicted in the memory hole over the buffer layer 1202. The silicon cap layer helps to prevent interface defects. The silicon cap layer 1204 is in direct contact with the buffer layer 1202, in one embodiment.

Optional step 1106 includes performing a thermal anneal. Step 1106 is performed in connection with step 1104. Thus, if step 1104 is not performed, then step 1106 need not be performed. The thermal anneal is performed at about 800 to 900 degrees Celsius, in one embodiment.

Step 1108 includes growing a solid pillar of crystalline SiGe in the memory hole. This is epitaxial growth in some embodiments. In one embodiment, the precursors are $GeH_4$, $SiH_4$, and $SiCl_2H_2$. In one embodiment, the solid pillar of crystalline silicon germanium comprises $Si_{1-x}Ge_x$, wherein x is greater than 0.5 throughout the solid pillar.

In one embodiment, the solid pillar of SiGe has a graded concentration of germanium. In one embodiment, the solid pillar comprises $Si_{1-x}Ge_x$, wherein "x" varies from 0.5 to 0.7. The germanium concentration may increase with distance from the crystalline silicon substrate 201.

Figure 12C:
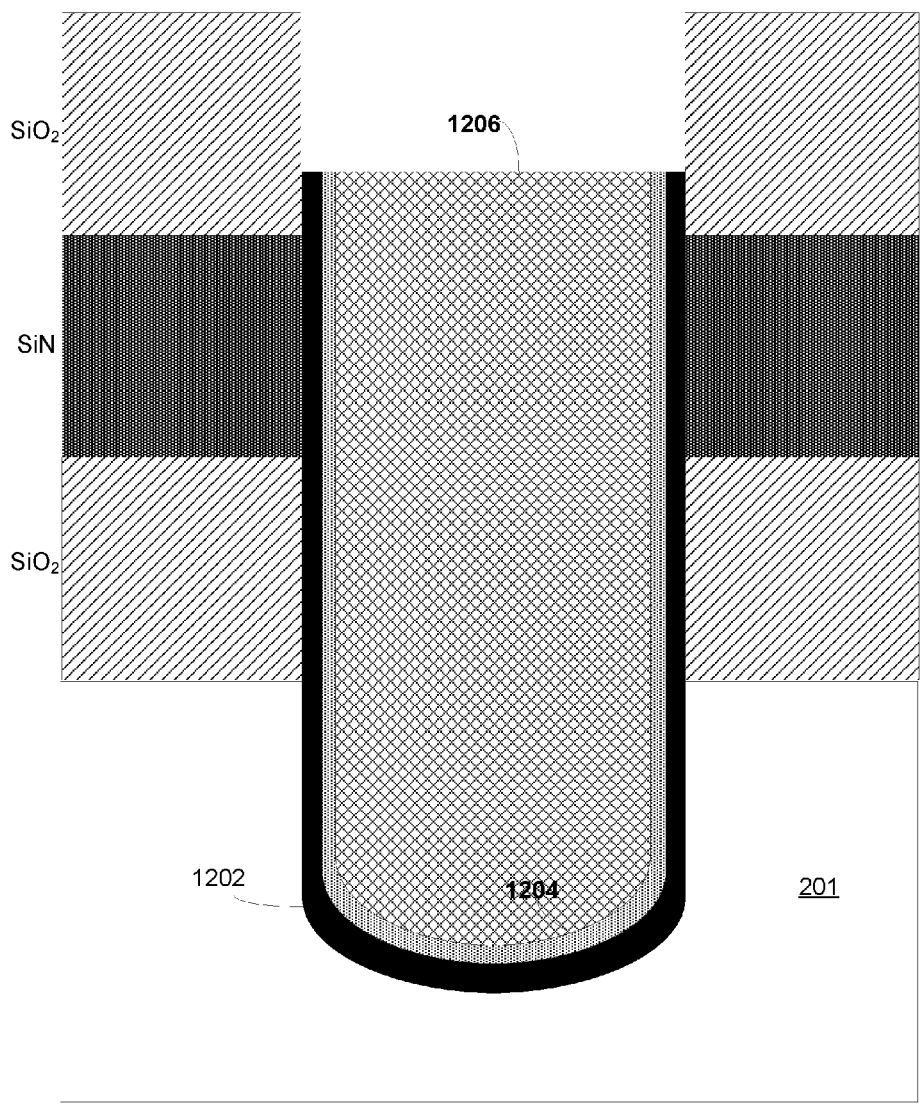

FIG. 12C is a diagram showing results after one embodiment of step 1108. Regions 1202, 1204, and 1206 are one embodiment of a body 506 comprising epitaxial crystalline silicon germanium (SiGe) in direct contact with the single crystal silicon substrate 201. In this example, layer 1202 is in direct contact with the single crystal silicon substrate 201. In one embodiment, region 1206 is a single crystal of SiGe that has the same crystalline orientation as the single crystal silicon substrate 201.

Figure 12D:
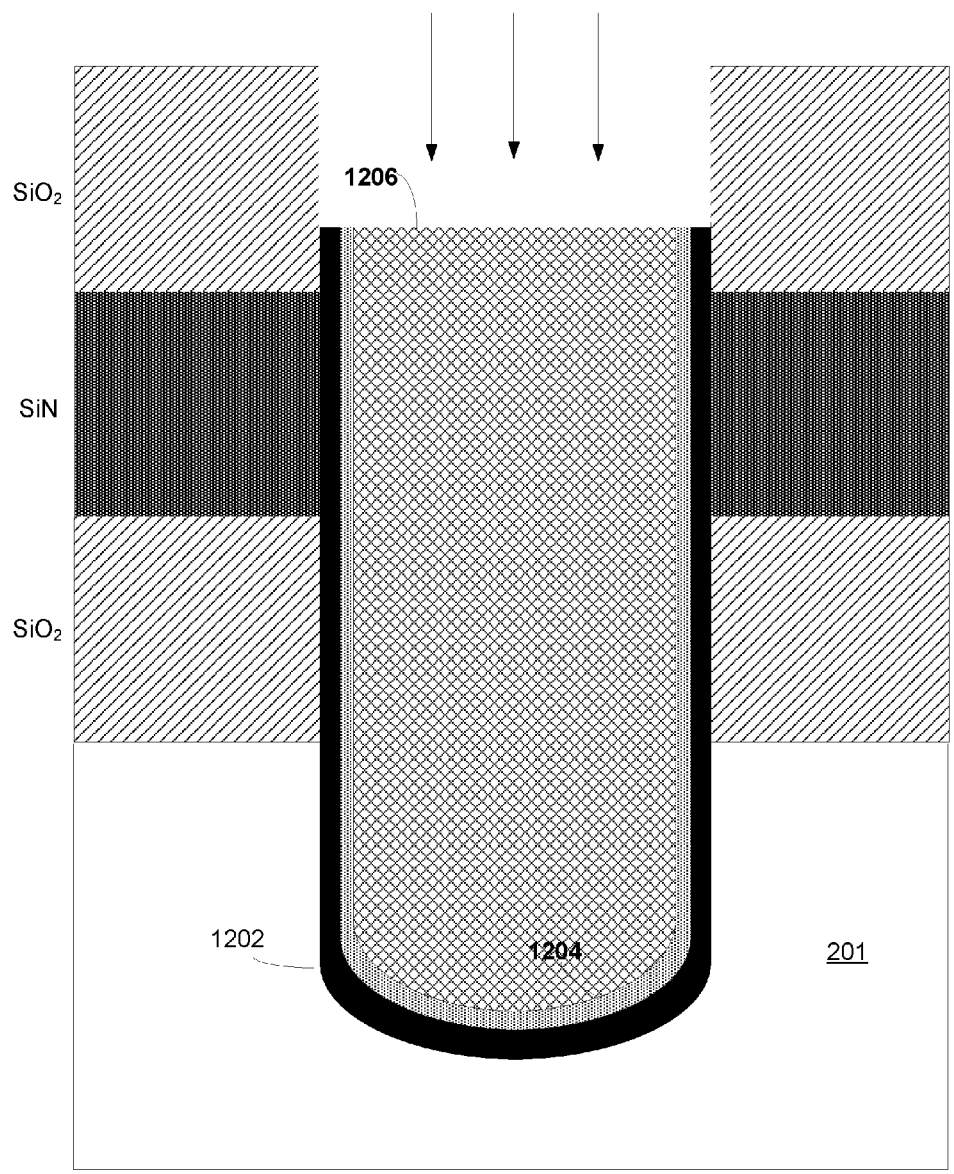

Step 1110 includes an optional fluorine plasma treatment. The fluorine plasma treatment can improve the interface between the crystalline SiGe body 506 and the SiGe to be formed later. The fluorine may prevent germanium redistribution from the NAND channel to the crystalline SiGe body 506. Also, the strong bond between silicon and fluorine reduces or eliminates dangling bond formation at the interface between the crystalline SiGe body 506 and the SiGe NAND channel. Furthermore, the strong bond between silicon and fluorine provides for high thermal stability. FIG. 12D is a diagram representing the fluorine plasma treatment being performed. The arrows represent fluorine being implanted into the top surface of the crystalline SiGe body 506. After step 1108, a SiGe channel 471 may be formed in contact with the epitaxial crystalline SiGe body 506, along with other layers of a memory cell film. The SiGe channel 471 may be in direct contact with the epitaxial crystalline SiGe body 506, or there may be one or more layers intervening between the SiGe channel 471 and the epitaxial crystalline SiGe body 506.

One embodiment disclosed herein includes an apparatus comprising a single crystal silicon substrate, a select transistor comprising a body comprising epitaxial crystalline silicon germanium (SiGe) in contact with the single crystal silicon substrate, and a string of memory cells having a string channel comprising silicon germanium in contact with the epitaxial crystalline silicon germanium of the select transistor body.

One embodiment disclosed herein includes a method of fabricating a three dimensional memory device. The method comprises forming a select transistor adjacent to a single crystal silicon substrate, which comprises epitaxially forming a select transistor body comprising single crystal silicon germanium in contact with the single crystal silicon substrate. The method also comprises forming a string of memory cells having a string channel, which comprises forming the string channel comprising silicon germanium in contact with the single crystal silicon germanium of the select transistor body.

One embodiment disclosed herein includes a method of fabricating a NAND string in a three-dimensional memory array. The method comprises: forming alternating layers of insulating material and sacrificial material in a stack above a single crystal silicon substrate; forming an opening in the insulating material and the sacrificial material down to the single crystal silicon substrate; epitaxially growing a buffer layer of crystalline silicon germanium at a bottom of the opening in direct contact with the single crystal silicon substrate, the buffer layer comprising $Si_{1-x}Ge_x$, wherein x is less than 0.5 where the buffer layer directly contacts the single crystal silicon substrate; epitaxially growing a pillar of crystalline silicon germanium over the buffer layer in the opening at the bottom of the opening; forming a memory cell film in the opening, the memory cell film comprising a silicon germanium channel for the NAND string in contact with the pillar of crystalline silicon germanium; removing the alternating layers of sacrificial material leaving recesses; forming a control gate for a source side select gate of the NAND string in a recess adjacent to the pillar of crystalline silicon germanium; and forming control gates for memory cells in recesses adjacent the memory cell film.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles and practical applications, to thereby enable others skilled in the art to best utilize the various embodiments and with various modifications as are suited to the particular use contemplated. It is intended that the scope be defined by the claims appended hereto.

What is claimed is:

1. An apparatus comprising:
    a single crystal silicon substrate having a crystalline structure;
    a select transistor comprising:
        a body comprising crystalline silicon germanium (SiGe) having a crystalline structure in contact with the single crystal silicon substrate; and
    a string of memory cells having a string channel comprising silicon germanium in contact with the crystalline silicon germanium of the select transistor body, wherein the crystalline structure of the crystalline silicon germanium is aligned with the crystalline structure of the single crystal silicon substrate.

2. The apparatus of claim 1, wherein the body comprises a solid pillar of single crystal silicon germanium.

3. The apparatus of claim 1, wherein the crystalline silicon germanium is formed from $Si_{1-x}Ge_x$, wherein x is greater than 0.5.

4. The apparatus of claim 1, wherein the silicon germanium in the string channel is formed from $Si_{1-x}Ge_x$, wherein x is greater than 0.5.

5. The apparatus of claim 1, wherein the string of memory cells comprises a memory cell film comprising a charge storage film, a gate dielectric film adjacent the charge storage film, wherein the string channel is adjacent the gate dielectric film, wherein the silicon germanium in the string channel is graded with concentration of germanium increasing gradually in a direction away from the gate dielectric film.

6. The apparatus of claim 1, wherein:
    the crystalline silicon germanium is formed from $Si_{1-x}Ge_x$; and
    the silicon germanium in the string channel is formed from $Si_{1-x}Ge_x$, wherein x is substantially the same for both the body and the string channel.

7. The apparatus of claim 6, wherein x is greater than 0.5.

8. A method of fabricating an apparatus, the method comprising:
    forming a select transistor adjacent to a single crystal silicon substrate, comprising:
        forming a select transistor body comprising crystalline silicon germanium (SiGe) in contact with the single crystal silicon substrate, including forming a silicon rich buffer layer of silicon germanium in direct contact with the single crystal silicon substrate, wherein the silicon rich buffer layer is formed from $Si_{1-x}Ge_x$, wherein x is less than 0.5; and
    forming a string of memory cells having a string channel comprising silicon germanium in contact with the crystalline silicon germanium of the select transistor body.

9. The method of claim 8, wherein forming the silicon rich buffer layer of silicon germanium comprises:
   epitaxially forming crystalline silicon germanium in direct contact with the single crystal silicon substrate.

10. The method of claim 9, wherein forming the select transistor body further comprises:
    epitaxially forming a solid pillar of single crystal silicon germanium over the silicon rich buffer layer, the solid pillar of single crystal silicon germanium comprising $Si_{1-x} Ge_x$, wherein x is greater than 0.5 throughout the solid pillar.

11. The method of claim 10, further comprising:
    forming a layer of silicon in direct contact with the silicon rich buffer layer of silicon germanium, wherein the solid pillar of single crystal silicon germanium is formed in contact with the layer of silicon.

12. The method of claim 11, further comprising:
    performing a thermal anneal after forming the layer of silicon in direct contact with the silicon rich buffer layer of silicon germanium.

13. The method of claim 8, wherein forming the string of memory cells comprises:
    forming the string channel from $Si_{1-x} Ge_x$, wherein x is greater than 0.5.

14. The method of claim 10, wherein:
    the silicon germanium in the string channel is formed from $Si_{1-x} Ge_x$, wherein x is substantially the same for both the solid pillar and the string channel.

15. The method of claim 8, further comprising:
    performing a fluorine plasma treatment on the select transistor body comprising crystalline silicon germanium prior to forming the string channel comprising silicon germanium in contact with the crystalline silicon germanium of the select transistor body.

16. An apparatus comprising:
    a single crystal silicon substrate;
    a select transistor comprising:
      a body comprising crystalline silicon germanium (SiGe) in contact with the single crystal silicon substrate, wherein the body comprises a silicon rich buffer layer of silicon germanium in direct contact with the single crystal silicon substrate, wherein the silicon rich buffer layer is formed from $Si_{1-x} Ge_x$, wherein x is less than 0.5; and
    a string of memory cells having a string channel comprising silicon germanium in contact with the crystalline silicon germanium of the select transistor body.

17. The apparatus of claim 16, wherein the body comprises a solid pillar of single crystal silicon germanium.

18. An apparatus comprising:
    a single crystal silicon substrate;
    a select transistor comprising:
      a body comprising crystalline silicon germanium (SiGe) in contact with the single crystal silicon substrate, wherein the body comprises a graded buffer layer of silicon germanium in contact with the single crystal silicon substrate, wherein concentration of germanium increases gradually in a direction away from the single crystal silicon substrate and concentration of silicon decreases gradually in the direction away from the single crystal silicon substrate; and
    a string of memory cells having a string channel comprising silicon germanium in contact with the crystalline silicon germanium of the select transistor body.

19. The apparatus of claim 18, wherein the body comprises a solid pillar of single crystal silicon germanium.

* * * * *